US008961735B2

(12) United States Patent
Fujino et al.

(10) Patent No.: US 8,961,735 B2
(45) Date of Patent: Feb. 24, 2015

(54) PLASMA PROCESSING APPARATUS AND MICROWAVE INTRODUCTION DEVICE

(75) Inventors: Yutaka Fujino, Nirasaki (JP); Atsushi Ueda, Nirasaki (JP); Shigenori Ozaki, Nirasaki (JP); Junichi Kitagawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 169 days.

(21) Appl. No.: 13/425,872

(22) Filed: Mar. 21, 2012

(65) Prior Publication Data

US 2012/0247676 A1 Oct. 4, 2012

(30) Foreign Application Priority Data

Mar. 31, 2011 (JP) ................................. 2011-080078
Aug. 6, 2011 (JP) ................................. 2011-172458

(51) Int. Cl.
| | | |
|---|---|---|
| C23C 16/00 | (2006.01) | |
| C23F 1/00 | (2006.01) | |
| H01L 21/306 | (2006.01) | |

(Continued)

(52) U.S. Cl.
CPC ..... *H01J 37/32238* (2013.01); *H01J 37/32211* (2013.01); *H05H 1/46* (2013.01); *H05H 2001/463* (2013.01)
USPC ............................. 156/345.41; 118/723 MW

(58) Field of Classification Search
CPC ................. H01J 37/32192–37/32311
USPC ............................. 156/345.41; 118/723 MW
See application file for complete search history.

(56) References Cited

U.S. PATENT DOCUMENTS

| | | | |
|---|---|---|---|
| 5,639,309 A | | 6/1997 | Akimoto |
| 5,645,644 A | * | 7/1997 | Mabuchi et al. ...... 118/723 MW |
| 6,717,368 B1 | * | 4/2004 | Sakamoto et al. ....... 315/111.21 |

(Continued)

FOREIGN PATENT DOCUMENTS

| | | |
|---|---|---|
| JP | 8-255785 | 10/1996 |
| JP | 10-92797 | 4/1998 |

(Continued)

OTHER PUBLICATIONS

English Machine Translation JP 2007-258093, Nagatsu dated Oct. 4, 2007.*

(Continued)

*Primary Examiner* — Rakesh Dhingra
(74) *Attorney, Agent, or Firm* — Oblon, McClelland, Maier & Neustadt, L.L.P.

(57) ABSTRACT

A plasma processing apparatus includes a microwave introduction device which introduces a microwave into a process chamber. The microwave introduction device includes a plurality of microwave transmitting plates which is fitted into a plurality of openings of a ceiling. The microwave transmitting plates are arranged on one virtual plane parallel to a mounting surface of a mounting table, with the microwave transmitting plates fitted into the respective openings. The microwave transmitting plates includes first to third microwave transmitting plates. The first to third microwave transmitting plates are arranged in such a manner that a distance between the center point of the first microwave transmitting window and the center point of the second microwave transmitting window becomes equal or approximately equal to a distance between the center point of the first microwave transmitting window and the center point of the third microwave transmitting window.

6 Claims, 15 Drawing Sheets

(51) Int. Cl.
  *H01J 37/32* (2006.01)
  *H05H 1/46* (2006.01)

(56) References Cited

U.S. PATENT DOCUMENTS

| | | | |
|---|---|---|---|
| 7,445,690 B2 | 11/2008 | Kasai et al. | |
| 2004/0029339 A1* | 2/2004 | Yamamoto et al. | 438/222 |
| 2011/0061814 A1 | 3/2011 | Ikeda | |
| 2012/0090782 A1* | 4/2012 | Ikeda et al. | 156/345.28 |
| 2012/0177542 A1* | 7/2012 | Chang et al. | 422/186.01 |

FOREIGN PATENT DOCUMENTS

| | | | |
|---|---|---|---|
| JP | 2004-128385 | 4/2004 | |
| JP | 2005-129323 A | 5/2005 | |
| JP | 2007-258093 * | 10/2007 | H05H 1/46 |
| JP | 2009-224493 | 10/2009 | |

OTHER PUBLICATIONS

Office Action issued Aug. 1, 2013, in Korean Patent Application No. 10-2012-0033452.

* cited by examiner

PLASMA PROCESSING APPARATUS AND MICROWAVE INTRODUCTION DEVICE

CROSS-REFERENCE TO RELATED APPLICATION

This application claims priority to Japanese Patent Application No. 2011-080078 filed on Mar. 31, 2011 and Japanese Patent Application No. 2011-172458 filed on Aug. 6, 2011, the entire contents of which are incorporated herein by reference.

FIELD OF THE INVENTION

The present invention relates to a plasma processing apparatus which is capable of supplying a microwave having a predetermined frequency into a process chamber and generating plasma used to process an object, and a microwave introduction device for use in the plasma processing apparatus.

BACKGROUND OF THE INVENTION

As one example of plasma processing apparatuses for performing a predetermined plasma process on an object such as a semiconductor wafer or the like, there has been known a slot antenna type plasma processing apparatus for generating plasma by introducing a microwave into a process chamber using a planar antenna having a plurality of slots. As another example, there has been known an inductively coupled plasma (ICP) type plasma processing apparatus for generating plasma by introducing a high frequency power into a process chamber using a coil antenna. These plasma processing apparatuses can generate high density plasma in the process chamber and perform various processes such as oxidation, nitriding, deposition, etching and so on by using the generated plasma.

In view of developing the next generation devices, for example in order to cope with 3D device processing and miniaturization and achieve high productivity, there is a need to increase a diameter of a wafer from 300 mm to 450 mm while securing process uniformity in a plane of the wafer. To this end, there is a need to make uniform a plasma (density) distribution in a process chamber large-sized to correspond to the wafer.

In the slot antenna type plasma processing apparatus, a plasma distribution has been controlled based on shape and arrangement of slots, design in shape of a process chamber or a microwave introduction window, and the like. For example, there was a need of replacement with a planar antenna having other optimally adjusted slot shape or arrangement in order to change the plasma distribution depending on process contents. In addition, also in the ICP type plasma processing apparatus, there was a need of replacement with an antenna having other optimally adjusted coil shape or arrangement in order to change the plasma distribution. However, such antenna replacement was huge effort and time-consuming work for redesign and so on.

A plasma distribution may be adjusted to optimal plasma environments by changing process parameters such as, for example, microwave power, process pressure, flow rate, and so on. However, since these process parameters cannot be separated from process conditions, a range of variation (margin) of the plasma distribution in a changeable range of the process parameters was small and an effect of such adjustment is limited.

In addition, if the plasma distribution becomes eccentric by collapse of symmetry of plasma in the process chamber due to various factors such as manufacturing tolerance, assembly error and difference between devices having the same specifications of a planar antenna, a process chamber and so on, there is no simple means for correcting this eccentricity, which may result in need of big change of devices such as replacement of the planar antenna and so on.

As one example of plasma processing apparatuses capable of improving productivity, there has been proposed a plasma processing apparatus which includes four dielectric line members used to process four targeted substrates having a large area simultaneously, for example as disclosed in Japanese Patent Application Publication No. H8-255785 (JP8-255785A). As another example, there has been proposed a plasma processing apparatus which includes two microwave introducing windows arranged in parallel in order to obtain a uniform plasma distribution for a large-sized object, for example as disclosed in Japanese Patent Application Publication No. H10-92797 (JP10-92797A). In the plasma processing apparatuses disclosed in JP8-255785A and JP10-92797A, microwaves are introduced from a plurality of portions into a process chamber.

Japanese Patent Application Publication No. 2004-128385 (JP2004-128385A) discloses a technique in which microwaves are emitted from four divided antennas and are combined in a space. Japanese Patent Application Publication No. 2009-224493 (JP2009-224493A) discloses a technique for spatially combining a plurality of microwaves introduced from a plurality of antenna modules into a chamber.

In order to make a plasma distribution in a process chamber uniform, as in the plasma processing apparatuses disclosed in JP8-255785A and JP10-92797A, it is considered to introduce microwaves from a plurality of portions into the process chamber and control distributions of a plurality of plasmas produced by these microwaves. However, the technique disclosed in JP8-255785A in which one dielectric line member is provided for one targeted substrate does not consider controlling the distributions of the plasmas. In addition, the technique disclosed in JP10-92797A is hard to control plasma distributions in an extension direction of the microwave introducing windows although it can control the plasma distributions in a direction perpendicular to the extension direction of the microwave introducing windows.

JP2004-128385A and JP2009-224493A do not disclose a detailed method of controlling plasma distributions although they disclose a spatial-combination of microwaves.

SUMMARY OF THE INVENTION

In view of the above, the present invention provides a plasma processing apparatus which supplies a microwave at a plurality of portion into a process chamber and a microwave introduction device for use in the plasma processing apparatus, wherein it is possible to make plasma distribution uniform with a simple structure.

In accordance with an aspect of the present invention, there is provided a plasma processing apparatus including: a process chamber for accommodating an object to be processed; a mounting table placed within the process chamber, the mounting table having mounting surface on which the object is mounted; a gas supply mechanism for supplying a process gas into the process chamber; and a microwave introduction device for generating a microwave to produce plasma of the process gas in the process chamber and for introducing the microwave into the process chamber, wherein the microwave introduction device includes a conductive member which is disposed above the process chamber and has a plurality of openings, and a plurality of microwave transmitting windows which is fitted into the respective openings and transmits and introduces the microwave into the process chamber, wherein the microwave transmitting windows are arranged on one virtual plane parallel to the mounting surface, with the microwave transmitting windows fitted into the respective openings, the microwave transmitting windows including a first microwave transmitting window and second and third microwave windows adjacent to the first microwave transmitting window, and wherein the first to third microwave transmitting windows are arranged in such a manner that a distance between the center point of the first microwave transmitting window and the center point of the second microwave transmitting window becomes equal or approximately equal to a distance between the center point of the first microwave transmitting window and the center point of the third microwave transmitting window.

In accordance with another aspect of the present invention, there is provided a microwave introduction device for generating a microwave to produce plasma of the process gas in a process chamber accommodating an object and for introducing the microwave into the process chamber, including: a conductive member which is disposed above the process chamber and has a plurality of openings; and a plurality of microwave transmitting windows which is fitted into the respective openings and transmits and introduces the microwave into the process chamber, wherein the microwave transmitting windows are arranged on one virtual plane parallel to the mounting surface, with the microwave transmitting windows fitted into the respective openings, the microwave transmitting windows including a first microwave transmitting window and second and third microwave windows adjacent to the first microwave transmitting window, and wherein the first to third microwave transmitting windows are arranged in such a manner that a distance between the center point of the first microwave transmitting window and the center point of the second microwave transmitting window becomes equal or approximately equal to a distance between the center point of the first microwave transmitting window and the center point of the third microwave transmitting window.

In the plasma processing apparatus and the microwave introduction device, the plasma distribution based on the microwave transmitting windows is formed by combination of plasma distributions generated by the microwaves introduced into the process chamber from the microwave transmitting windows. In the present invention, the "plane shape" means "a shape seen from in a direction perpendicular to the mounting surface". Further, in the present invention, "the center point of the microwave transmitting window" means "the center point in the plane shape of the microwave transmitting window".

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

First Embodiment

Figure 1:
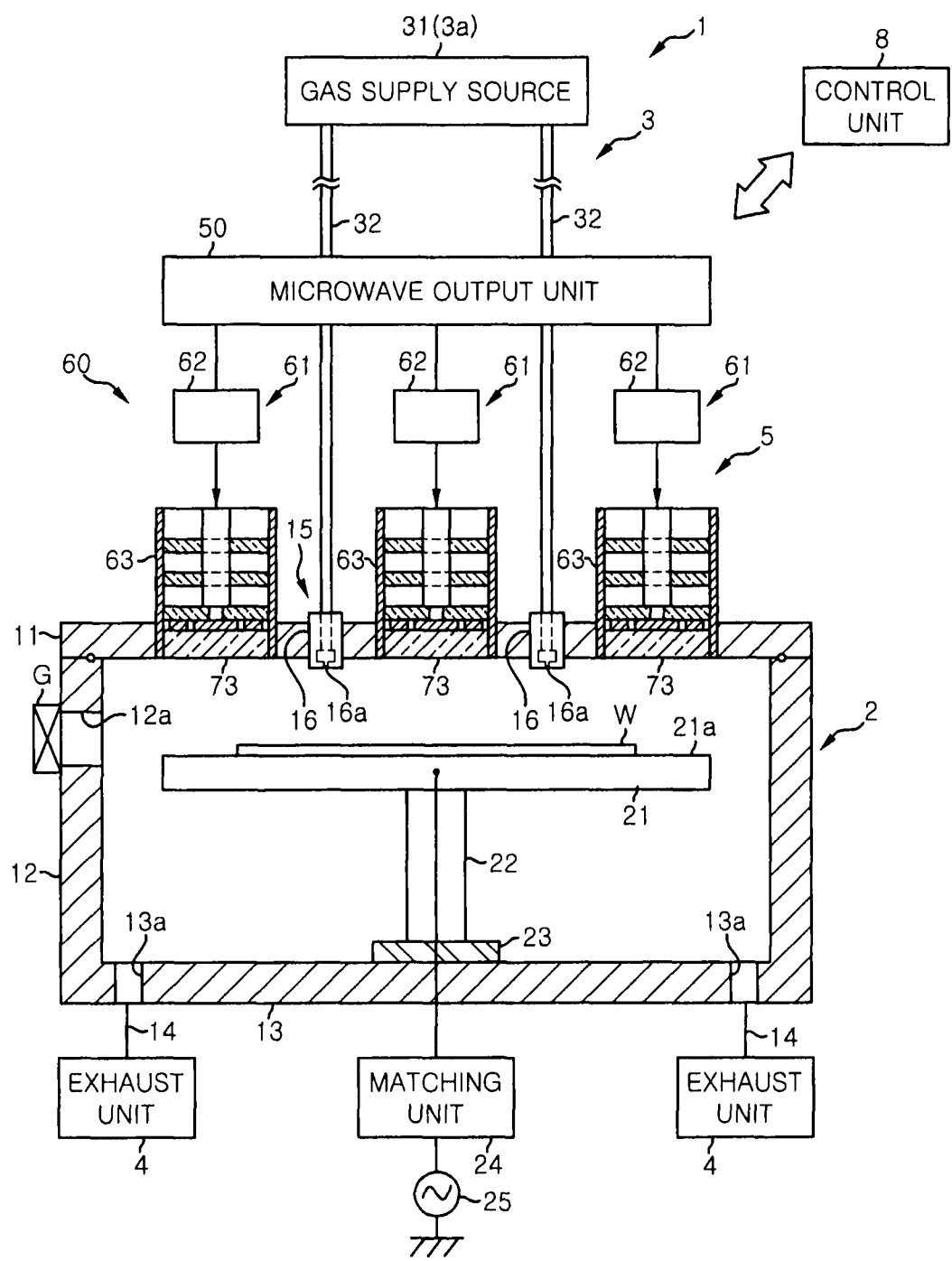
FIG. 1 is a sectional view showing schematic configuration of a plasma processing apparatus according to a first embodiment of the present invention.
Figure 2:
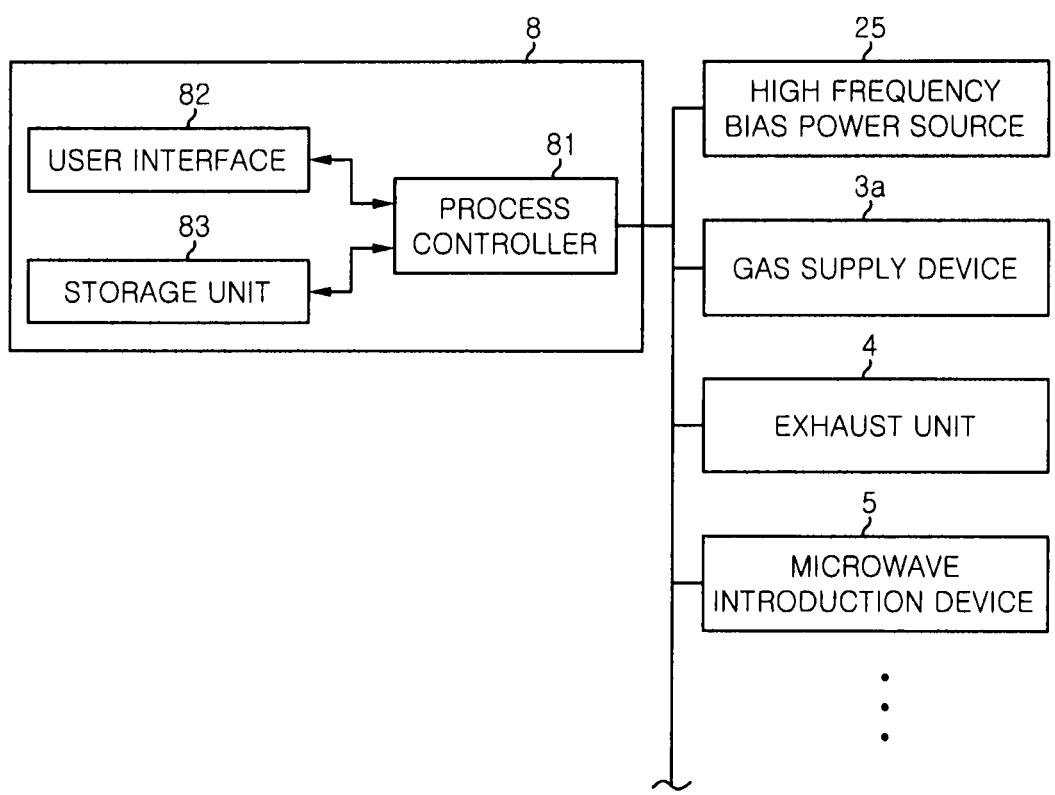
FIG. 2 is an explanatory view showing configuration of a control unit shown in FIG. 1.

Hereinafter, embodiments of the present invention will be described in detail with reference to the accompanying drawings. First, schematic configuration of a plasma processing apparatus according to a first embodiment of the present invention will be described with reference to FIGS. 1 and 2. FIG. 1 is a sectional view showing schematic configuration of a plasma processing apparatus according to this embodiment. FIG. 2 is an explanatory view showing configuration of a control unit shown in FIG. 1. In this embodiment, a plasma processing apparatus 1 is an apparatus for subjecting a semiconductor wafer for manufacture of a semiconductor device or the like (hereinafter abbreviated as a "wafer") W to predetermined processes such as film forming, diffusing, etching, and ashing in accordance with a plurality of consecutive operations.

The plasma processing apparatus 1 includes a process chamber 2 which accommodates a wafer W as a target object, a mounting table 21 which is placed within the process chamber and has a mounting surface 21a on which the wafer W is mounted, a gas supply mechanism 3 which supplies gas into the process chamber 2, an exhaust unit 4 which decompresses and exhausts the interior of the process chamber 2, a microwave introduction device 5 which generates a microwave to produce plasma within the process chamber 2 and introduces the microwave into the process chamber 2, and a control unit 8 which controls these components of the plasma processing apparatus 1. As a means for supplying gas into the process chamber 2, an external gas supply mechanism which is not included in the plasma processing apparatus 1 may be used instead of the gas supply mechanism 3.

The process chamber 2 has a cylindrical shape, for example. The process chamber 2 is made of, for example, metal material such as aluminum, an alloy thereof, or the like. The microwave introduction device 5 is disposed above the process chamber 2 and serves as a plasma generating unit for generating plasma by introducing an electromagnetic wave (microwave) into the process chamber 2. Detailed configuration of the microwave introduction device 5 will be described later.

The process chamber 2 includes a plate-like ceiling 11, a bottom 13, and a side wall 12 connecting the ceiling 11 and the bottom 13. The ceiling 11 has a plurality of openings. The side wall 12 has a loading/unloading port 12a through which the wafer W is loaded from and unloaded to a transfer chamber (not shown) adjacent to the process chamber 2. A gate valve G is provided between the process chamber 2 and the transfer chamber (not shown). The gate valve G serves to open and close the loading/unloading port 12a. The gate valve G air-tightly seals the process chamber 2 in a closed state and allows the wafer W to be transferred between the process chamber 2 and the transfer chamber (not shown) in an opened state.

The bottom 13 has a plurality of (two in FIG. 2) exhaust holes 13a. The plasma processing apparatus 1 further includes an exhaust pipe 14 connecting the exhaust holes 13a and the exhaust unit 4. The exhaust unit 4 includes an APC valve and a high speed vacuum pump for depressurizing the interior of the process chamber 2 to a predetermined degree of vacuum at a high speed. An example of such a high speed vacuum pump may include a turbo molecular pump or the like. By actuation of the high speed vacuum pump of the exhaust unit 4, the interior of the process chamber 2 is depressurized to a predetermined degree of vacuum, for example, 0.133 Pa.

The plasma processing apparatus 1 further includes a support member 22 which supports the mounting table 21 in the process chamber 2, and an insulating member 23 which is interposed between the support member 22 and the bottom 13 of the process chamber 2 and is made of insulating material. The mounting table 21 serves to mount thereon the wafer W as the object horizontally. The support member 22 has a cylindrical shape extending from the center of the bottom 13 to the interior of the process chamber 2. The mounting table 21 and the support member 22 are formed of aluminum or the like whose surface is subjected to alumite process (anode oxidation), for example.

The plasma processing apparatus 1 further includes a high frequency bias power source 25 which supplies high frequency power to the mounting table 21, and a matching unit 24 interposed between the mounting table 21 and the high frequency bias power source 25. The high frequency bias power source 25 supplies the high frequency power to the mounting table to attract ions to the wafer W.

Although not shown, the plasma processing apparatus 1 further includes a temperature control mechanism which heats or cools the mounting table 21. The temperature control mechanism controls temperature of the wafer W within a range of 25° C. (room temperature) to 900° C., for example.

In addition, the mounting table 21 has a plurality of support pins provided to protrude beyond and retract below the mounting surface 21a. The support pins are vertically movable by any elevation mechanism to transfer and receive the wafer W to and from the transfer chamber (not shown) at a raised position.

The plasma processing apparatus 1 further includes a gas introduction unit 15 provided in the ceiling 11 of the process chamber 11. The gas introduction unit 15 has a plurality of cylindrical nozzles 16. The nozzles 16 have respective gas holes formed in their respective bottoms. Arrangement of the nozzles 16 will be described later.

The gas supply mechanism 3 includes a gas supply device 3a including a gas supply source 31, and a pipeline 32 connecting the gas supply source 31 and the gas introduction unit 15. Although a single gas supply source 31 is shown in FIG. 1, the gas supply device 3a may include two or more gas supply sources depending on the kind of gas used.

The gas supply source 31 is used to supply a rare gas for plasma generation, a process gas used for oxidation, nitriding, film forming, etching, ashing and so on. Examples of the rare gas for plasma generation may include Ar, Kr, Xe, He and the like. Examples of the process gas used for oxidation may include an oxidizing gas such as oxygen gas, ozone gas, $NO_2$ gas and the like. Examples of the process gas used for nitriding may include nitrogen gas, $NH_3$ gas, $N_2O$ gas and the like. If a CVD process is performed in the process chamber 2, the gas supply source 31 is used to supply a film forming material gas, a purge gas used to substitute the internal atmosphere of the process chamber 2, cleaning gas used to clean the interior of the process chamber 2, and so on. Examples of the film forming material may include $TiCl_4$ gas and $NH_3$ gas. Examples of the purge gas may include $N_2$ gas, Ar gas and so on. Examples of the cleaning gas may include $ClF_3$ gas, $NF_3$ gas and so on. Examples of etching gas may include $CF_4$ gas, HBr gas and so on. Examples of ashing gas may include oxygen gas and so on.

Although not shown, the gas supply device 3a further includes a mass flow controller and an opening/closing valve which are disposed in the course of the pipeline 32. The kind, flow rate and the like of the gas supplied into the process chamber 2 are controlled by the mass flow controller and the opening/closing valve.

The above-described various components of the plasma processing apparatus 1 are connected to and controlled by the control unit 8. The control unit 8 is typically a computer. In the example shown in FIG. 2, the control unit 8 includes a process controller 81 having a CPU, and a user interface 82 and a storage unit 83 both of which are connected to the process controller 81.

The process controller 81 is a control unit for collectively controlling various components involved with the process conditions of, for example, temperature, pressure, flow rate, high frequency bias power, microwave power and so on (for example, the high frequency bias power source 25, the gas supply device 3a, the exhaust unit 4, the microwave introduction device 5 and so on) in the plasma processing apparatus 1.

The user interface 82 includes a keyboard or touch panel to allow a process operator to input commands to manage the plasma processing apparatus 1, a display for visually displaying operation situations of the plasma processing apparatus 1, and so on.

The storage unit 83 stores control programs (software) for realizing various processes performed in the plasma processing apparatus 1 under control of the process controller 81, and recipes in which process condition data and so on are recorded. The process controller 81 calls and executes any control program and recipes from the storage unit 83 according to an instruction from the user interface 82, if necessary. Accordingly, a desired process is performed in the process chamber 2 of the plasma processing apparatus 1 under control of the process controller 81.

Examples of the control programs and the recipes may include control programs and recipes stored in a computer readable storage medium such as a CD-ROM, hard disk, flexible disk, flash memory, DVD, Blue Ray disk and so on. The recipes may be frequently received on-line from other apparatuses via a dedicated line.

Figure 3:
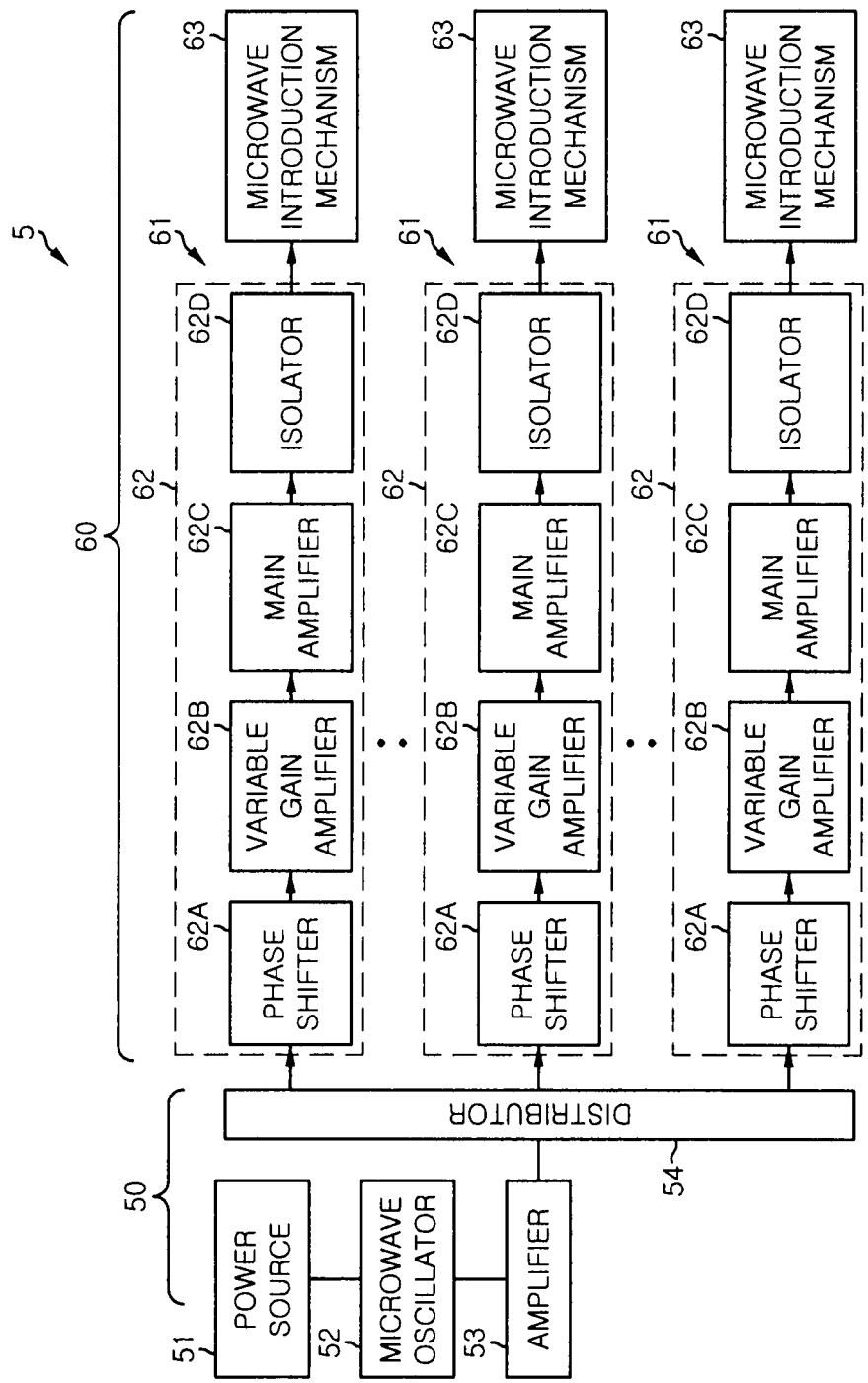
FIG. 3 is an explanatory view showing configuration of a microwave introduction device shown in FIG. 1.
Figure 4:
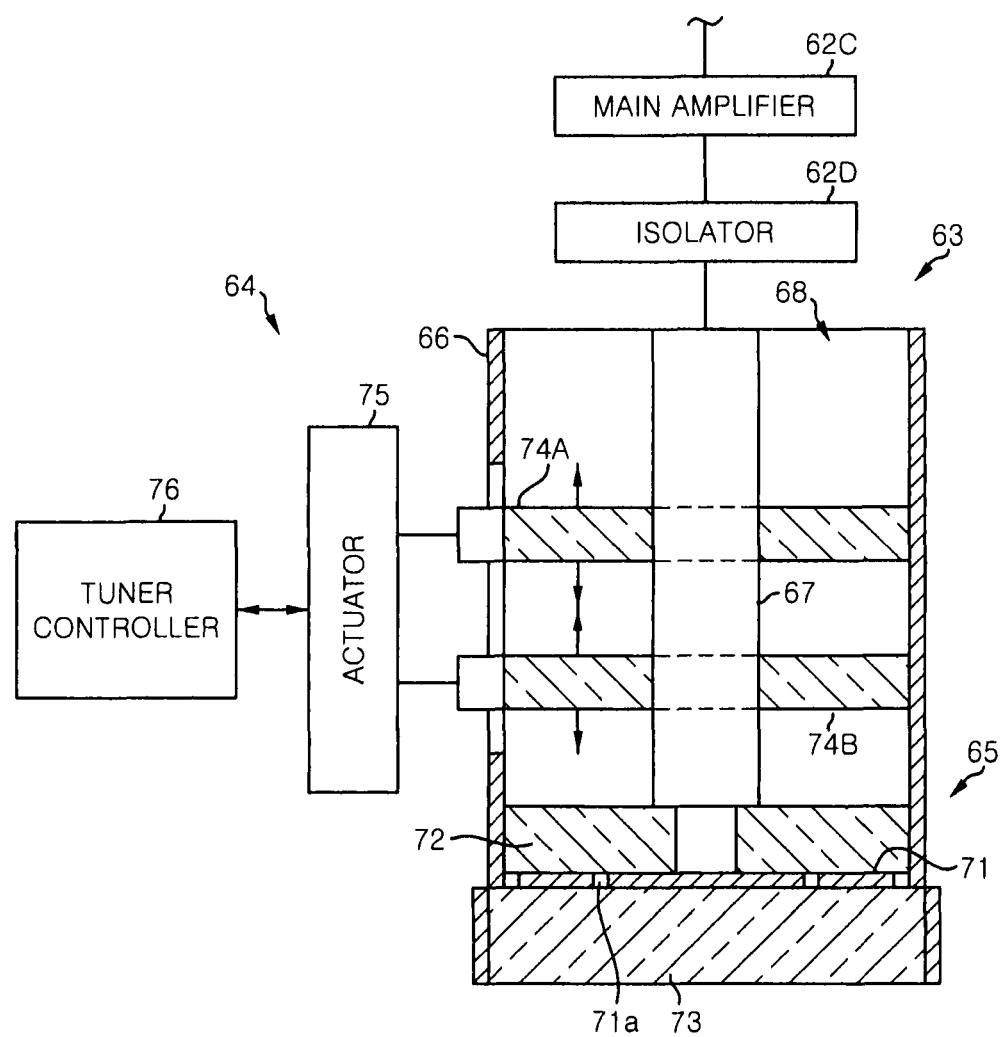
FIG. 4 is a sectional view showing a microwave introduction mechanism shown in FIG. 3.
Figure 5:
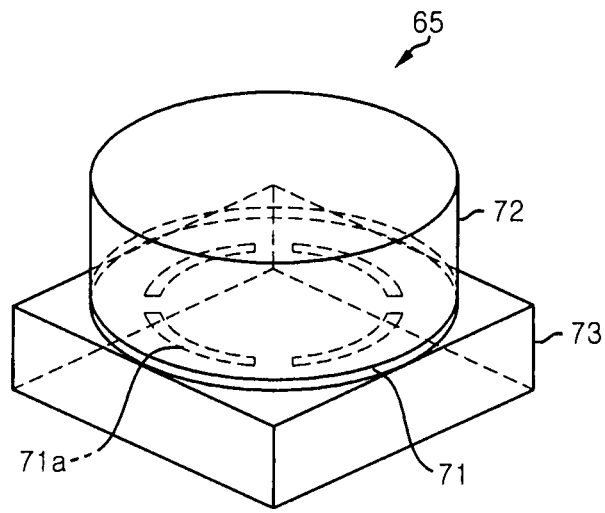
FIG. 5 is a perspective view showing an antenna unit of the microwave introduction mechanism shown in FIG. 4.
Figure 6:
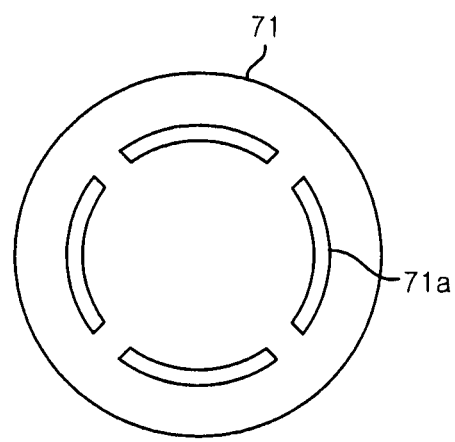
FIG. 6 is a plan view showing a planar antenna of the microwave introduction mechanism shown in FIG. 4.

Next, configuration of the microwave introduction device 5 will be described in detail with reference to FIGS. 1 and 3 to 6. FIG. 3 is an explanatory view showing configuration of the microwave introduction device 5. FIG. 4 is a sectional view showing a microwave introduction mechanism shown in FIG. 3. FIG. 5 is a perspective view showing an antenna unit of the microwave introduction mechanism shown in FIG. 4. FIG. 6 is a plan view showing a planar antenna of the microwave introduction mechanism shown in FIG. 4.

As described above, the microwave introduction device 5 is disposed above the process chamber 2 and serves as a plasma generating unit for generating plasma by introducing an electromagnetic wave (microwave) into the process chamber 2. As shown in FIGS. 1 and 3, the microwave introduction device 5 includes the ceiling 11 which is a conductive member having a plurality of openings, a microwave output unit 50 which generates a microwave and distributes and outputs the microwave into a plurality of paths, and an antenna unit 60 which introduces the microwave output from the microwave output unit 50 into the process chamber 2. In this embodiment, the ceiling 11 of the process chamber 2 also serves as a conductive member of the microwave introduction device 5.

The microwave output unit 50 includes a power source 51, a microwave oscillator 52, an amplifier 53 which amplifies a microwave oscillated by the microwave oscillator 52, and a distributor 54 which distributes the microwave amplified by the amplifier 53 into a plurality of paths. The microwave oscillator 2 oscillates a microwave with a predetermined frequency (for example 2.45 GHz). Without being limited to 2.45 GHz, the frequency of the microwave may be 8.35 GHz, 5.8 GHz, 1.98 GHz and so on. This microwave output unit 50 may be applied to a case where the frequency of the microwave falls within a range of 800 MHz to 1 GHz. The distributor 54 distributes the microwave while matching input impedance with output impedance.

The antenna unit 60 includes a plurality of antenna modules 61. Each of the plurality of antenna modules 61 introduces the microwave distributed by the distributor 54 into the process chamber 2. In this embodiment, the antenna modules 61 have the same configuration. Each antenna module 61 includes an amplification unit 62 which mainly amplifies and outputs the distributed microwave, and a microwave introduction mechanism 63 which introduces the microwave output from the amplification unit 62 into the process chamber 2. Each antenna module 61 corresponds to a microwave introduction module in the present invention.

The amplification unit 62 includes a phase shifter 62A which changes a phase of the microwave, a variable gain amplifier 62B which adjusts a power level of the microwave to be input to a main amplifier 62C, the main amplifier 62C which is configured as a solid state amplifier, and an isolator 62D which separates a reflecting microwave reflected from antenna unit of the microwave introduction mechanism 63, which will be described later, toward the main amplifier 62C.

The phase shifter 62A is configured to change the phase of the microwave, thereby changing a radiation characteristic of the microwave. The phase shifter 62A is used to control directionality of the microwave to change a plasma distribution by adjusting the phase of the microwave for each antenna module 61. If no adjustment of such a radiation characteristic is performed, the phase shifter 62A may not be provided.

The variable gain amplifier 62B is used for adjustment of deviations of the individual antenna modules 61 and adjustment of plasma intensity. For example, the overall plasma distribution in the process chamber 2 may be adjusted by changing the variable gain amplifier 62B for each antenna module 61.

Although not shown, the main amplifier 62C includes, for example, an input matching circuit, a semiconductor amplifying element, an output matching circuit and a high Q resonance circuit. Examples of the semiconductor amplifying element may include GaAsHEMT, GaNHEMT and LD (Laterally Diffused)-MOS which are class E-operable.

The isolator 62D includes a circulator and a dummy load (coaxial terminator). The circulator serves to send the microwave reflected from the antenna unit of the microwave introduction mechanism 63, which will be described later, to the dummy load. The dummy load serves to convert the reflecting microwave sent by the circulator into heat. As described above, in this embodiment, the antenna modules 61 are provided and a plurality of microwaves introduced into the process chamber 2 by means of the respective microwave introduction mechanisms 63 of the plurality of antenna modules 61 is combined together in the process chamber 2. Accordingly, each isolator 62D may be small-sized and may be disposed adjacent to the main amplifier 62C.

As shown in FIG. 1, the microwave introduction mechanisms 63 may be disposed in the ceiling 11. As shown in FIG. 4, each of the microwave introduction mechanisms 63 includes a tuner 64 which matches impedance, an antenna unit 65 which radiates an amplified microwave into the process chamber 2, a cylindrical body container 66 which extends vertically in FIG. 4, and an inner conductor 67 which extends in the body container 66 in the same direction as the extension of the body container 66. The body container 66 and the inner conductor 67 constitute a coaxial tube. The body container 66 constitutes an outer conductor of the coaxial tube. The inner conductor 67 has a bar-like or barrel-like shape. A space between the inner circumference of the body container 66 and the outer circumference of the inner conductor 67 forms a microwave transmission line 68.

Although not shown, the antenna module 61 has a power feed converter provided in a base end (upper end) of the body container 66. The power feed converter is connected to the main amplifier 62C via a coaxial cable. The isolator 62D is disposed in the course of the coaxial cable.

The antenna unit 65 is disposed in the opposite side to the power feed converter in the main container 66. As will be described later, a portion of the base end other than the antenna unit 65 in the body container 66 corresponds to a range of impedance adjustment by the tuner 64.

As shown in FIGS. 4 and 5, the antenna unit 65 includes a planar antenna 71 connected to the bottom of the inner conductor 67, a microwave retardation member 72 disposed at the top side of the planar antenna 71, and a microwave transmitting plate 73 disposed at the bottom side of the planar antenna 71. The bottom of the microwave transmitting plate 73 is exposed to the interior of the process chamber 2. The microwave transmitting plate 73 is fitted into the openings of the ceiling 11 which is the conductive member of the microwave introduction device 5. The microwave transmitting plate 73 corresponds to a microwave transmitting window in the present invention.

The planar antenna 71 has a disc shape. The planar antenna 71 has slots 71a formed to penetrate through the planar antenna 71. In the example shown in FIGS. 5 and 6, four slots 71a are provided, each of which has a circular arc shape equally divided into four portions. Without being limited to four, the number of slots 71a may be one to three or five or more.

The microwave retardation member 72 is made of material having a dielectric constant larger than vacuum. Examples of the material of the microwave retardation member 72 may include quartz, ceramics, fluorine-based resin such as polytetrafluoroethylene resin, polyimide resin and so on. A microwave has a longer wavelength in vacuum. The microwave retardation member 72 serves to adjust plasma by making the wavelength of the microwave short. A phase of the microwave is varied depending on thickness of the microwave retardation member 72. Accordingly, by adjusting the phase of the microwave depending on the thickness of the microwave retardation member 72, the planar antenna 71 can be adjusted to be placed at a loop position of a standing wave. Accordingly, it is possible to suppress a reflected wave in the planar antenna 71 and increase radiation energy of the microwave emitted from the planar antenna 71. That is, power of the microwave can be efficiently introduced into the process chamber 2.

The microwave transmitting plate 73 is made of dielectric material. Examples of the dielectric material of the microwave transmitting plate 73 may include quartz, ceramic and so on. The microwave transmitting plate 73 has a shape to allow the microwave to be efficiently emitted in a TE mode. In the example shown in FIG. 5, the microwave transmitting plate 73 has a rectangular parallelepiped shape. Without being limited to the rectangular parallelepiped shape, the microwave transmitting plate 73 may have, for example, a cylindrical shape, a pentagonal pillar shape, a hexagonal pillar shape or an octagonal pillar shape.

In the microwave introduction mechanism 63 as configured above, the microwave amplified by the main amplifier 62C arrives at the planar antenna 71 via a space between the inner circumference of the body container 66 and the outer circumference of the inner conductor 67 (that is, via the microwave transmission line 68) and is introduced into the interior of the process chamber 2 through the slots 71a of the planar antenna 71 via the microwave transmitting plate 73.

The tuner 64 forms a slag tuner. Specifically, as shown in FIG. 4, the tuner 64 includes two slags 74A and 74B disposed in a portion of the base end (top side) other than the antenna unit 65 in the body container 66, an actuator 75 which actuates the two slags 74A and 74B, and a tuner controller 76 which controls the actuator 75.

The slags 74A and 74B have a plate shape or an annular shape and are interposed between the inner circumference of the body container 66 and the outer circumference of the inner conductor 67. The slags 74A and 74B are made of dielectric material. An example of the material of the slags 74A and 74B may include high purity alumina having a relative dielectric constant of 10. The high purity alumina typically has a relative dielectric constant higher than that (3.88) of quartz and that (2.03) of Teflon®, both of which are used as material to form slags, so that thickness of the slags 74A and 74B can be decreased. In addition, the high purity alumina has an advantage of small dielectric tangent (tan δ) and small microwave loss over quartz and Teflon®. The high purity alumina has another advantage of small distortion and high heat resistance. Preferably, the high purity alumina is an alumina sintered body having the purity of more than 99.9%. Single crystal alumina (sapphire) may be also used as the high purity alumina.

The tuner 64 moves the slags 74A and 74B vertically by means of the actuator 75 according to an instruction from the tuner controller 76. This allows the tuner 64 to adjust impedance. For example, the tuner controller 76 adjusts position of the slags 74A and 74B such that impedance of a termination becomes 50Ω.

In this embodiment, the main amplifier 62C, the tuner 64 and the planar antenna 71 are disposed adjacent to each other. In particularly, the tuner 64 and the planar antenna 71 constitutes a lumped constant circuit and serves as a resonator. Impedance mismatch exists in an attachment portion of the planar antenna 71. In this embodiment, by virtue of the tuner 64, high density tuning, including plasma, is feasible and an effect of reflection in the planar antenna 71 can be alleviated. In addition, by virtue of the tuner 64, impedance mismatch up to the planar antenna 71 can be alleviated with high density and a substantial mismatching portion can be assumed as a plasma space. This allows the tuner 64 to control plasma with high density.

Figure 7:
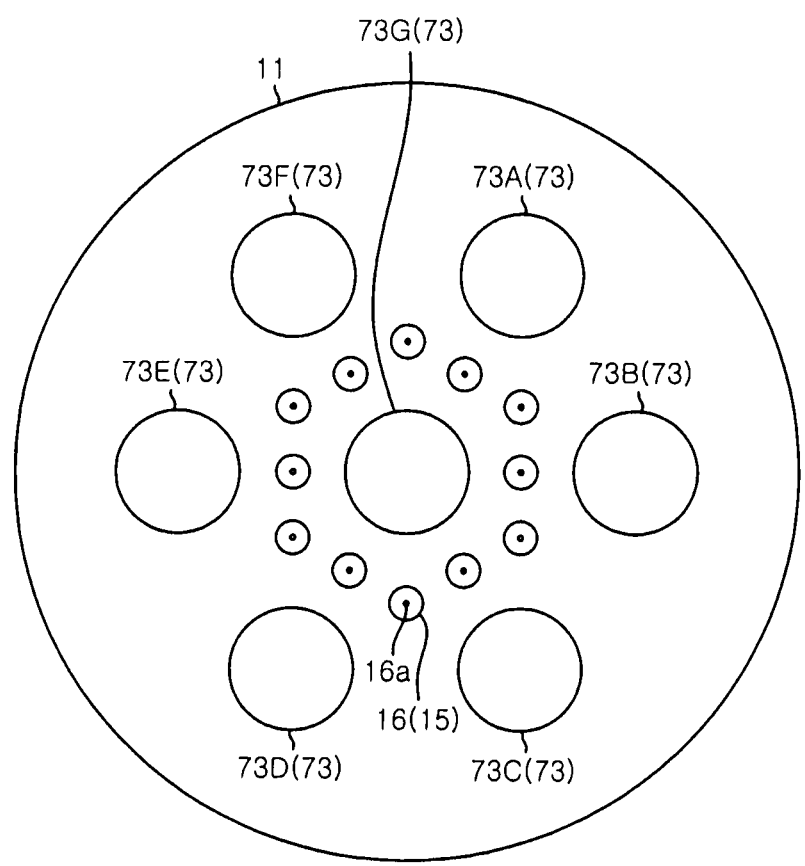
FIG. 7 is a bottom view of a ceiling of a process chamber shown in FIG. 1.
Figure 8:
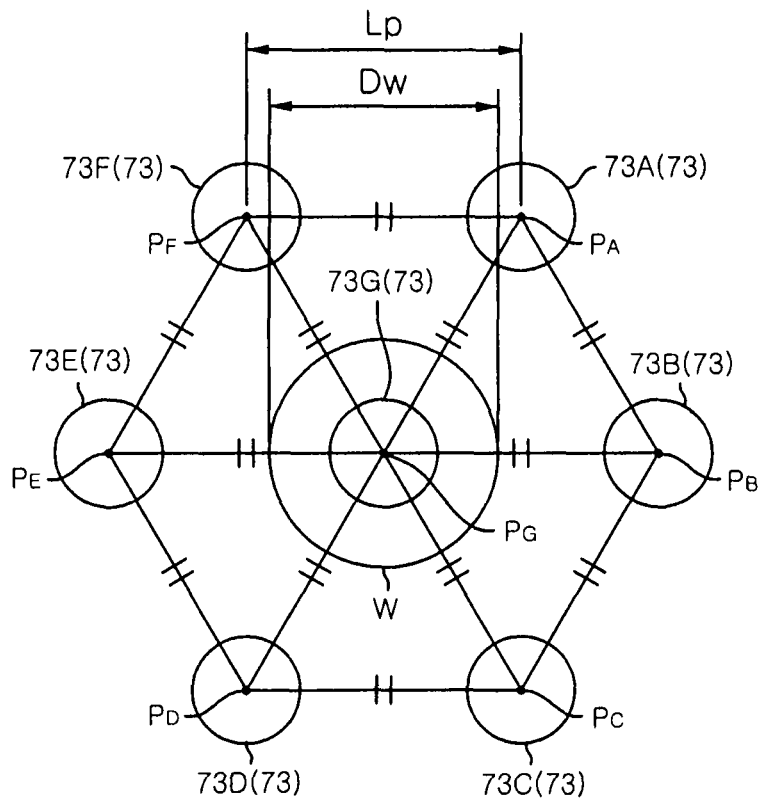
FIG. 8 is an explanatory view showing arrangement of a plurality of microwave transmitting plates according to the first embodiment of the present invention.

Next, arrangement of the microwave transmitting plate 73 will be described with reference to FIGS. 7 and 8. FIG. 7 is a bottom view of the ceiling 11 of the process chamber 2 shown in FIG. 1. FIG. 8 is an explanatory view showing arrangement of a plurality of microwave transmitting plates 73 according to this embodiment. The body container 66 is not shown in FIG. 7. In the following description, it is assumed that the microwave transmitting plate 73 has a cylindrical shape.

The microwave introduction device 5 includes a plurality of microwave transmitting plates 73. As described above, each of the microwave transmitting plates 73 corresponds to a microwave transmitting window in the present invention. With the microwave transmitting plates 73 fitted into a plurality of openings of the ceiling 11 which is the conductive member of the microwave introduction device 5, the microwave transmitting plates 73 are arranged on a single virtual plane in parallel to the mounting surface 21a of the mounting table 21. The microwave transmitting plates 73 include three microwave transmitting plates 73 with distances between the centers thereof equal or approximately equal to each other in the virtual plane. The approximate equality of distances between the centers thereof means that positions of the microwave transmitting plates 73 may be slightly deviated from a desired position from the standpoint of shape precision of the microwave transmitting plates 73 and assembly precision of the antenna module 61 (the microwave introduction mechanism 63).

In this embodiment, the microwave transmitting plates 73 include seven microwave transmitting plates 73 arranged with a hexagonal closest packing structure. Specifically, the microwave transmitting plates 73 include six microwave transmitting plates 73A to 73F arranged with their centers coinciding or approximately coinciding with apexes of a regular hexagon, respectively, and one microwave transmitting plate 73G arranged with its center coinciding or approximately coinciding with the center of the regular hexagon. In FIG. 8, '$P_A$' to '$P_G$' denote the center points of the microwave transmitting plates 73A to 73G, respectively. The approximate coincidence with the apexes or the center of the regular hexagon means that the center points of the microwave transmitting plates 73 may be slightly deviated from the apexes or center of the regular hexagon from the standpoint of shape precision of the microwave transmitting plates 73 and assembly precision of the antenna module 61 (the microwave introduction mechanism 63).

As shown in FIG. 7, the microwave transmitting plate 73G is arranged in the central portion in the ceiling 11. The six microwave transmitting plates 73A to 73F are arranged in the outside of the central portion of the ceiling 11 in a manner to surround the microwave transmitting plate 73G. Accordingly, the microwave transmitting plate 73G corresponds to a central microwave transmitting window in the present invention and the microwave transmitting plates 73A to 73F correspond to outer microwave transmitting windows in the present invention. In this embodiment, "the central portion of the ceiling 11" means a "central portion in a plane shape of the ceiling 11."

The microwave transmitting plates 73A to 73G are arranged with satisfaction of the following first and second conditions. The first condition is to form six regular triangles in a plane shape by connecting three adjacent center points of the center points $P_A$ to $P_G$ of the microwave transmitting plates 73A to 73G. The second condition is to form a virtual regular hexagon by means of these six regular triangles. As shown in FIG. 8, the virtual regular hexagon is formed when the center points $P_A$ to $P_F$ of the microwave transmitting plates 73A to 73F are interconnected to surround the microwave transmitting plate 73G.

In FIG. 8, 'W' denotes a figure formed by projecting a plane shape of the wafer W onto a virtual plane on which the microwave transmitting plate 73 are arranged (hereinafter referred simply to as a "plane shape of the wafer W"). In the example shown in FIG. 8, the plane shape of the wafer W is circular. In this embodiment, outer edges of the regular hexagon serving as the basis of the center points $P_A$ to $P_F$ of the microwave transmitting plates 73A to 73F include the plane shape of the wafer W. The center point $P_G$ of the microwave transmitting plate 73G coincides or approximately coincides with the center point of the plane shape (circle) of the wafer W. The center points $P_A$ to $P_F$ of the microwave transmitting plates 73A to 73F are arranged with an equal or approximately equal interval on the circumference of a concentric circle to the plane shape of the wafer W.

In this embodiment, in all the microwave transmitting plates 73, distances between the center points of any three microwave transmitting plates 73 are equal or approximately equal to each other. Hereinafter, this will be illustrated with the microwave transmitting plates 73A, 73B and 73G. As shown in FIG. 8, the center points $P_A$ and $P_B$ of the microwave transmitting plates 73A and 73B coincide with two adjacent apexes of the regular hexagon. The center point $P_G$ of the microwave transmitting plate 73G coincides with the center point of the regular hexagon. As shown in FIG. 8, a figure drawn by interconnecting the center points $P_A$, $P_B$ and $P_G$ becomes a regular triangle. Accordingly, distances between the center points $P_A$, $P_B$ and $P_G$ becomes equal to each other.

The above description of the microwave transmitting plates 73A, 73B and 73G is equally applied to any combination of three adjacent microwave transmitting plates 73. Accordingly, in this embodiment, for all the microwave transmitting plates 73, distances between the center points of any three adjacent microwave transmitting plates 73 becomes equal or approximately equal to each other. In addition, in the present invention, two adjacent microwave transmitting plates 73 satisfy the condition that different microwave transmitting plates 73 are not arranged on a first line segment interconnecting the center points of these two adjacent microwave transmitting plates 73, and the condition that the first line segment does not intersect a second line segment which interconnects the center points of two different microwave transmitting plates 73 and is shorter than the first line segment.

First to third microwave transmitting windows in the present invention will be now described. In the above description of the microwave transmitting plates 73A, 73B and 73G, for example, the microwave transmitting plate 73G corresponds to the first microwave transmitting window in the present invention and the microwave transmitting plates 73A and 73B correspond to the second and third microwave transmitting windows, which are adjacent to the first microwave transmitting window, respectively. As apparent from the above description, a distance between the center point $P_G$ of the microwave transmitting plate 73G and the center point $P_A$ of the microwave transmitting plate 73A (an inter-center point ($P_G$ and $P_A$) distance of the microwave transmitting plates 73G and 73A) becomes equal or approximately equal to a distance between the center point $P_G$ of the microwave transmitting plate 73G and the center point $P_B$ of the microwave transmitting plate 73B (an inter-center point ($P_G$ and $P_B$) distance of the microwave transmitting plates 73G and 73B).

If the microwave transmitting plate 73G corresponds to the first microwave transmitting window in the present invention, any two of the microwave transmitting plates 73A to 73F, without being limited to the microwave transmitting plates 73A and 73B, correspond to the second and third microwave transmitting windows in the present invention, respectively. In addition, the microwave transmitting plate 73A may correspond to the first microwave transmitting window in the present invention. In this case, any two of the microwave transmitting plates 73B, 73F and 73G corresponds to the second and third microwave transmitting windows in the present invention, respectively. Similarly, any one of the microwave transmitting plates 73B to 73F may correspond to the first microwave transmitting window in the present invention.

By the way, for one of combinations of microwave transmitting plates 73 [(73A, 73B, 73G), (73B, 73C, 73G), (73C, 73D, 73G), (73D, 73E, 73G), (73E, 73F, 73G), (73F, 73A, 73G)] corresponding to the first to third microwave transmitting windows, if the microwave transmitting plate 73G corresponds to the first microwave transmitting window in the present invention, the first to third microwave transmitting windows are adjacent to each other. In this case, distances between the center points of the first and second microwave transmitting windows, between the center points of the first and third microwave transmitting windows and between the center points of the second and third microwave transmitting windows become equal or approximately equal to each other. In the above description of the microwave transmitting plates 73A, 73B and 73G, distances between the center points $P_G$ and $P_A$ of the microwave transmitting plates 73G and 73A, between the center points $P_G$ and $P_B$ of the microwave transmitting plates 73G and 73B and between the center points $P_A$ and $P_B$ of the microwave transmitting plates 73A and 73B become equal or approximately equal to each other.

As shown in FIG. 4, the microwave introduction mechanism 63 has an integral structure including the microwave transmitting plates 73. In this embodiment, a plurality of microwave introduction mechanisms 63 includes seven microwave introduction mechanisms 63. The microwave introduction mechanisms 63 are arranged to correspond to positions in which the microwave transmitting plates 73 shown in FIGS. 7 and 8 are arranged. In addition, as shown in FIG. 7, a plurality of nozzles 16 of the gas introduction unit 15 is arranged to surround the microwave transmitting plate 73G between the microwave transmitting plates 73A to 73F and the microwave transmitting plate 73G.

Figure 9:
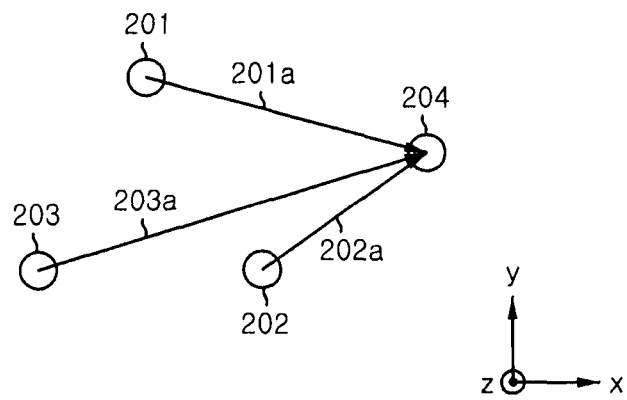
FIG. 9 is a schematic explanatory view showing a relationship between a plasma source and measuring points.
Figure 10:
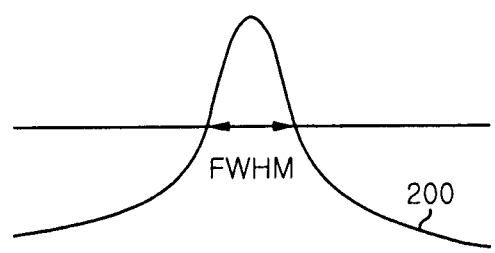
FIG. 10 is a schematic explanatory view showing a density distribution of plasma.

Next, a preferred range of distance between the center points of any two microwave transmitting plates 73 will be described. First, plasma density of any measuring points on the mounting surface 21a of the mounting table 21 will be described with reference to FIGS. 8 to 10. FIG. 9 is a schematic explanatory view showing a relationship between a plasma source and measuring points. FIG. 10 is a schematic explanatory view showing a plasma density distribution. The plasma source corresponds to the microwave transmitting plate 73 in this embodiment. In FIG. 9, reference numerals 201, 202 and 203 denote any three plasma sources. Reference numeral 204 denotes a measuring point on the mounting surface 21a. Arrows annexed with reference numerals 201a, 202a and 202c schematically indicate plasma from the plasma sources 201, 202 and 203 toward the measuring point 204. In FIG. 10, a curve annexed with reference numeral 200 indicates a density distribution of plasma generated by any plasma source. 'FWHM' indicates full width at half maximum of the plasma density distribution.

Here, x, y and z directions are defined as follows. The x and y directions are two directions which are in parallel to the mounting surface 21a of the mounting table 21 shown in FIG. 1 and are perpendicular to each other. The z direction is a direction which is perpendicular to the mounting surface 21a and gets away from the mounting surface 21a. It is assumed that z=0 in the mounting surface 21a. FIG. 9 shows the above-defined x, y and z directions.

The plasma sources are arranged on one virtual plane (coinciding with the virtual plane on which the microwave transmitting plates 73 are arranged) in parallel to the mounting surface 21a. Here, a distance between the virtual plane and the mounting surface 21a is represented by Z. A coordinate of any plasma source is represented by $(x_n, y_n, Z)$ and a coordinate of the measuring point is represented by $(X, Y, 0)$. Plasma density Ne(n) depending on any plasma source at the measuring point 204 is represented by the following equation (1).

$$Ne(n)(X,Y) = a_n \cdot \exp[-\{(X-x_n)^2 + (Y-y_n)^2\}/2\sigma^2] 2\pi\sigma^2 \quad (1)$$

Equation (1) is an empirically obtained approximate expression. $\sigma^2$ is expressed by the following equation (2).

$$\sigma^2 = FWHM^2/(8 \cdot \ln 2) \quad (2)$$

$a_n$ and $\sigma^2$ are coefficients related to plasma intensity and depend on power input to any plasma source and a distance (Z) from the virtual plane on which the plasma source is arranged to the mounting surface 21a.

As shown in FIG. 9, plasmas from the plasma sources arrive at the measuring point 204. Plasma density $Ne_{(total)}$ at the measuring point 204 depending on all the plasma sources may be expressed by the sum of plasma densities $Ne_{(n)}$ depending on n plasma sources, each of which is expressed by Equation (1). If plasmas from Np plasma sources arrive at the measuring point 204, the plasma density $Ne_{(total)}$ is expressed by the following equation (3).

$$Ne_{(total)} = \Sigma_{(n=1 \sim Np)} Ne_{(n)} \quad (3)$$

Next, a result of a first simulation for a preferred range of distance between the center points of any two adjacent microwave transmitting plates 73 will be described. In the first simulation, plasma density on a wafer W having a circular plane shape and a diameter Dw of 1 was calculated using the above equations (1) to (3). Arrangement of the plasma sources (that is, the microwave transmitting plates 73) was as shown in FIG. 8. In FIG. 8, 'Lp' denotes a distance between the center points of any two adjacent microwave transmitting plates 73. A plurality of microwave plasmas from the plurality of microwave transmitting plates 73 was the same density distribution. In reality, if a density distribution of microwave plasma in the process chamber 2 is made uniform, the plasma density distribution in the process chamber 2 is optimized by, for example, changing only a microwave plasma density distribution depending on the microwave transmitting plate 73G (the center microwave transmitting window).

In the first simulation, with Lp and FWHM varied within a range of 0.1 to 2.0, the microwave plasma density distribution on the wafer W was calculated and a degree of uniformity of the microwave plasma density distribution was calculated based on the obtained density distribution. A value (in percentage) obtained by dividing ½ of a difference between the maximum and the minimum of plasma densities on the wafer W by a mean value of the plasma densities on the wafer W was used as an indicator of the degree of uniformity of the microwave plasma density distribution.

Figure 11:
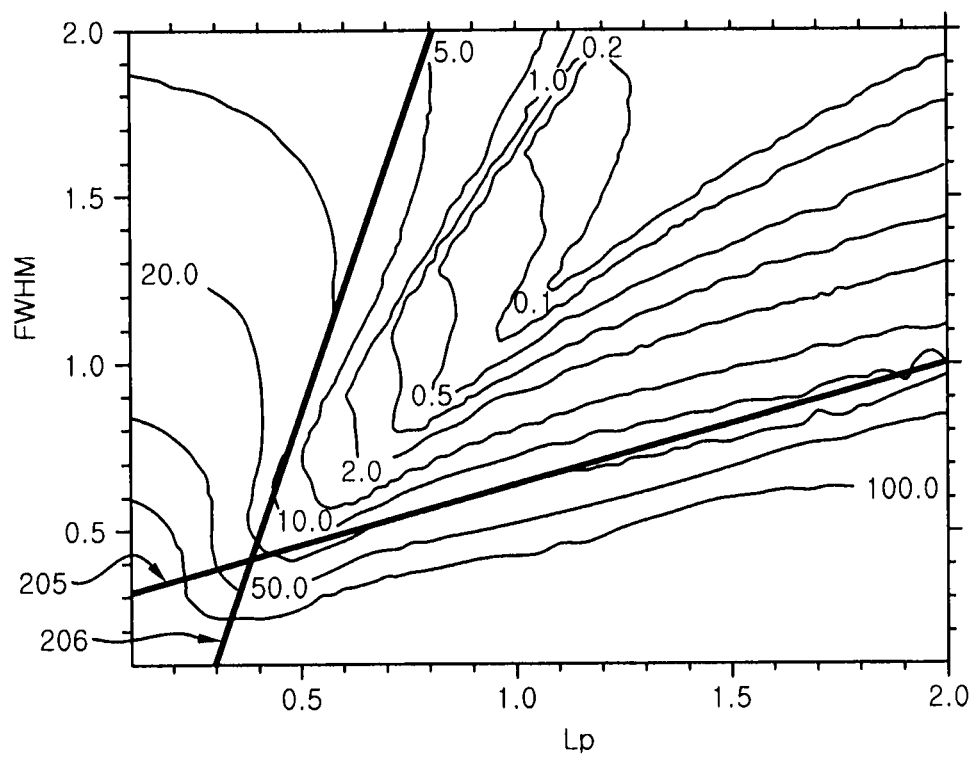
FIG. 11 is a characteristic view showing uniformity of a microwave plasma density distribution obtained according to a first simulation.

FIG. 11 shows a result of the first simulation. In FIG. 11, a horizontal axis represents Lp and a vertical axis represents FWHM. FIG. 11 shows values of the indicator of the degree of uniformity of the microwave plasma density distribution and curves drawn by interconnecting points having the equivalent values. It can be seen from FIG. 11 that the uniformity of the microwave plasma density distribution is improved with increase in Lp and FWHM.

The values of the indicator of the degree of uniformity of the microwave plasma density distribution are preferably equal to or less than, for example, 10%. To achieve this, it is preferable that Lp and FWHM satisfy the following equation (4).

$$0.37 \times Lp + 0.26 \leq FWHM \leq 3.80 \times Lp - 1.04 \quad (4)$$

In FIG. 11, reference numeral 205 denotes a straight line expressed by FWHM=0.37×Lp+0.26 and reference numeral 206 denotes a straight line expressed by FWHM=3.80×Lp−1.04. As can be understood from the result of the first simulation, when the microwave transmitting plates 73 are arranged as shown in FIG. 8, it is preferable that a distance Lp between the center points of any two adjacent microwave transmitting plates 73 satisfies the above equation (4).

Next, one example of the plasma process in the plasma processing apparatus 1 will be described. In this example, a procedure of the plasma process will be illustrated with a case where a nitrogen-containing gas is used as a process gas and the surface of the wafer W is subjected to plasma nitriding. First, an instruction to instruct the plasma processing apparatus 1 to perform the plasma nitriding is input to the process controller 81 through, for example, the user interface 82. Next, upon receiving this instruction, the process controller 81 reads out recipes stored in the storage unit 83 or a computer readable storage medium. Next, control signals are sent from the process controller 81 to various end devices of the plasma processing apparatus 1 (for example, the high frequency bias power source 25, the gas supply device 3a, the exhaust unit 4, the microwave introduction device 5 and so on) so that the plasma nitriding can be performed according to the conditions based on the recipes).

Next, with the gate valve G opened, the wafer W is loaded into the process chamber 2 via the gate valve G and the loading/unloading port 12a by means of a transfer device (not shown). The wafer W is mounted on the mounting surface 21a of the mounting table 21. Next, with the gate valve G closed, the interior of the process chamber 2 is depressurized and exhausted by the exhaust unit 4. Next, a rare gas and a nitrogen-containing gas are respectively introduced predetermined flow rates into the process chamber 2 via the gas introduction unit by means of the gas supply mechanism 3. The interior of the process chamber 2 is adjusted to a predetermined pressure by adjusting an amount of exhaustion and gas supply.

Next, the microwave output unit 50 generates a microwave to be introduced into the process chamber 2. A plurality of microwaves output from the distributor 54 of the microwave output unit 50 is input to the antenna modules 61 and then is introduced into the process chamber 2 by each of the antenna modules 61. In each antenna module 61, the microwave propagates through the amplification unit 62 and the microwave introduction mechanism 63. The microwave arrived at the antenna unit 65 of the microwave introduction mechanism 63 is emitted from the slots 71a of the planar antenna 71 above the wafer W in the process chamber 2 through the microwave transmitting plate 73. Thus, the microwaves are individually introduced from the antenna modules 61 into the process chamber 2.

The microwaves introduced from the antenna modules 61 into the process chamber 2 as described above form respective electromagnetic waves in the process chamber 2. Accordingly, process gases such as inert gas, nitrogen-containing gas and so on introduced into the process chamber 2 are plasmarized. Then, a silicon surface of the wafer W is nitrided by action of active species, for example, radicals and ions, in the plasma, thereby forming a thin film of silicon nitride (SiN).

When a control signal to end the plasma process is sent from the process controller 81 to each of the end devices of the plasma processing apparatus 1, the generation of the microwaves is stopped and the supply of the rare gas and the nitrogen-containing gas is stopped, thereby ending the plasma process for the wafer W. Next, with the gate valve G opened, the wafer W is unloaded by means of the transfer device (not shown).

Oxidation process for the wafer W may be performed by using an oxygen-containing gas instead of the nitrogen-containing gas. In addition, film forming process for the wafer W may be performed by using a film forming material gas by means of plasma CVD.

Next, effects of the plasma processing apparatus 1 of this embodiment will be described. In this embodiment, a distance between the center point of the microwave transmitting plate 73 corresponding to the first microwave transmitting window of the present invention and the center point of the microwave transmitting plate 73 corresponding to the second microwave transmitting window (distance between the center points of the first and second microwave transmitting windows) is set to be equal or approximately equal to a distance between the center point of the microwave transmitting plate 73 corresponding to the first microwave transmitting window of the present invention and the center point of the microwave transmitting plate 73 corresponding to the third microwave transmitting window (distance between the center points of the first and third microwave transmitting windows). Plasma density at any point on the wafer W is expressed by the sum of a plurality of plasma densities depending on the microwave transmitting plates 73, as described above with reference to Equations (1) to (3).

However, if distances between the center points of the adjacent microwave transmitting plates are different, there arise the following problems. It is here considered that any microwave transmitting plate (hereinafter referred to as a "fourth microwave transmitting plate") is spaced from two different microwave transmitting plates (hereinafter referred to as "fifth and sixth microwave transmitting plates"). A total microwave plasma density distribution depending on the fourth to sixth microwave transmitting plates corresponds to the sum of respective microwave plasma density distributions depending on these microwave transmitting plates. Accordingly, if the microwave transmitting plates provide the same microwave plasma density distribution, plasma density is decreased in the vicinity of the fourth microwave transmitting plate, while plasma density is increased in the vicinity of the fifth and sixth microwave transmitting plates. If there is such a variation in plasma density, for example, it may be considered to replace a planar antenna of an antenna module including the fourth microwave plate in order to adjust the microwave plasma density distribution depending on the fourth microwave transmitting plate, which may result in huge effort and time-consuming work. Alternatively, although it may be considered to finely adjust the microwave plasma density distribution depending on the fourth microwave transmitting plate by, for example, changing the power of the microwave, a range of variation (margin) of the microwave plasma density distribution in a changeable range of the microwave power is small and an effect of such adjustment is limited.

On the contrary, in this embodiment, since the distance between the center points of the first and second microwave transmitting windows is set to be equal or approximately equal to the distance between the center points of the first and third microwave transmitting windows, the microwave plasma density distribution can be easily made uniform. For example, if three microwave plasma density distributions depending on there respective microwave transmitting plates 73 become equal to each other by making configurations of the antenna modules, each of which has the microwave transmitting plate 73, equal to each other, at least a microwave plasma density distribution near the microwave transmitting plate 73 corresponding to the second microwave transmitting window becomes equal to a microwave plasma density distribution near the microwave transmitting plate 73 corresponding to the third microwave transmitting window. In this manner, according to this embodiment, it is possible to make uniform the microwave plasma density distributions with simple configuration.

In addition, in this embodiment, by equalizing the distance between the center points of the first and second microwave transmitting windows, the distance between the center points of the first and third microwave transmitting windows and the distance between the center points of the second and third microwave transmitting windows, it is easy to make the microwave plasma density distributions uniform. In this case, since the distances between the center points of the three microwave transmitting plates 73 corresponding respectively to the first to third microwave transmitting windows are equal or approximately equal to each other, it is possible to equalize three microwave plasma density distributions depending respectively on the three microwave transmitting plates 73. In this case, there arises no variation in plasma density near the three microwave transmitting plate 73. Thus, in this embodiment, there is no need of adjustment of microwave plasma density distributions by replacement of planar antennas and so on for alleviation of variations in plasma density. Accordingly, with this embodiment, it is possible to make the microwave plasma density distributions uniform with simple configuration.

In addition, in this embodiment, the microwave transmitting plate 73G is arranged in the central portion in the ceiling 11 and the six microwave transmitting plates 73A to 73F are arranged in the outside of the central portion of the ceiling 11 in a manner to surround the microwave transmitting plate 73G. In this embodiment, this makes it possible to make the microwave plasma density distribution uniform over a wide range.

In addition, in this embodiment, the antenna modules have the same configuration. Accordingly, with this embodiment, it is possible to use the same plasma generation conditions for the antenna modules 61 and adjust the microwave plasma density distributions easily.

In addition, plasma density below a region corresponding to the inner side of the regular hexagon becomes larger than plasma density below a region corresponding to the outer side of the regular hexagon. In this embodiment, outer edges of the regular hexagon serving as the basis of the center points of the microwave transmitting plates 73A to 73F include the plane shape of the wafer W. Accordingly, with this embodiment, it is possible to arrange the wafer W in a region having high plasma density.

By the way, it is considered to provide as many microwave transmitting plates as possible in order to make the microwave plasma density distributions uniform. A plasma processing apparatus having such a configuration will be hereinafter referred to as a first comparative example plasma processing apparatus. Other configurations in the first comparative example plasma processing apparatus are the same as the plasma processing apparatus 1 of this embodiment. The first comparative example plasma processing apparatus having such a configuration has the increased number of antenna modules 61, each of which includes a microwave transmitting plate, which results in high initial costs, high maintenance costs and poor workability.

In addition, in the first comparative example plasma processing apparatus, since the microwave transmitting plates are arranged close together, a gap between the microwave transmitting plates in the ceiling 11 of the process chamber 12 is small and the nozzles 16 of the gas introduction unit 15 cannot be freely arranged. In addition, since the microwave transmitting plates made of dielectric material are arranged, a surface area of the inner side of the process chamber 2 made of metal material, particularly, a surface area of the ceiling 11 corresponding to the conductive member in the present invention, is relatively decreased and a bias application efficiency depending on the high frequency power source 25 is likely to be deteriorated. In addition, an installation area of the microwave transmitting plates is increased and the process chamber 2 including the ceiling 11 becomes larger.

In contrast, according to this embodiment, it is possible to make microwave plasma density distributions uniform without having to provide many microwave transmitting plates. Accordingly, with this embodiment, the above-mentioned problems in the first comparative example plasma process apparatus will not occur.

Second Embodiment

Figure 12:
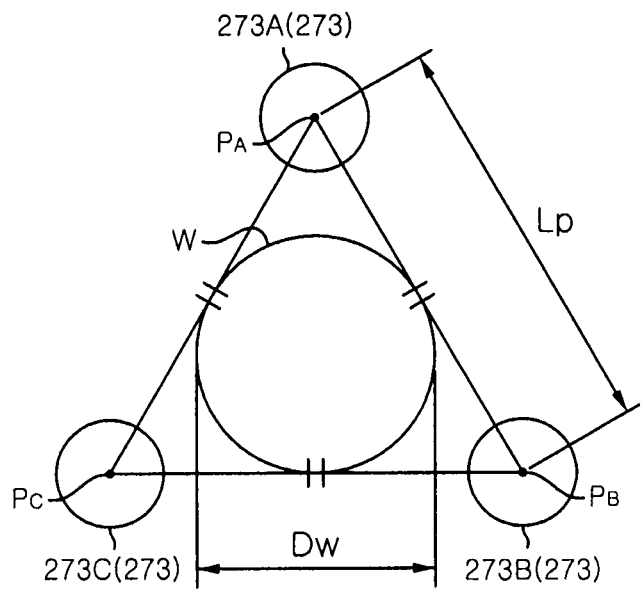
FIG. 12 is an explanatory view showing arrangement of a plurality of microwave transmitting plates according to a second embodiment of the present invention.

Next, a plasma processing apparatus according to a second embodiment of the present invention will be described with reference to FIG. 12. FIG. 12 is an explanatory view showing arrangement of a plurality of microwave transmitting plates according to this embodiment. The plasma processing apparatus of this embodiment has the basically same configuration as the plasma processing apparatus 1 of the first embodiment.

In this embodiment, the microwave introduction device 5 includes a plurality of microwave transmitting plates 273 instead of the microwave transmitting plates 73 in the first embodiment. The microwave transmitting plates 273 are arranged on one virtual plane in parallel to the mounting surface 21a of the mounting table 21. In addition, the microwave transmitting plates 273 include three microwave transmitting plates 273 with distances between their center points in their plane shape on the virtual plane equal or approximately equal to each other. In this embodiment, the microwave transmitting plates 273 include three microwave transmitting plates 273A, 273B and 273C with their center points coinciding or approximately coinciding with apexes of a regular triangle. In FIG. 12, 'P$_A$', 'P$_B$' and 'P$_C$' denote the center points of the microwave transmitting plates 273A, 273B and 273C, respectively. Distances Lp between the center points P$_A$, P$_B$ and P$_C$ of the three microwave transmitting plates 273A, 273B and 273C are equal or approximately equal to each other.

The microwave transmitting plates 273A, 273B and 273C are arranged to satisfy the conditions that a virtual regular triangle is formed by interconnecting the center points P$_A$, P$_B$ and P$_C$ of the microwave transmitting plates 273A, 273B and 273C. As shown in FIG. 12, the virtual regular triangle is formed when the center points P$_A$, P$_B$ and P$_C$ of the microwave transmitting plates 273A, 273B and 273C are interconnected.

In the example shown in FIG. 12, the plane shape of the wafer W is circular. In this embodiment, outer edges of the regular triangle serving as the basis of the center points of the microwave transmitting plates 273A to 273C include the plane shape of the wafer W. The center points P$_A$ to P$_C$ of the microwave transmitting plates 273A to 273C are arranged with an equal or approximately equal interval on the circumference of a concentric circle to the plane shape of the wafer W.

Next, similarly to the first simulation, a result of a second simulation for a preferred range of distance between the center points of any two adjacent microwave transmitting plates 273, that is, distances between the center points P$_A$, P$_B$ and P$_C$ of the three microwave transmitting plates 273A, 273B and 273C, will be described. In the second simulation, arrangement of the plasma sources (that is, the microwave transmitting plates 273A, 273B and 273C) was as shown in FIG. 12. Other conditions in the second simulation are the same as those in the first simulation.

Figure 13:
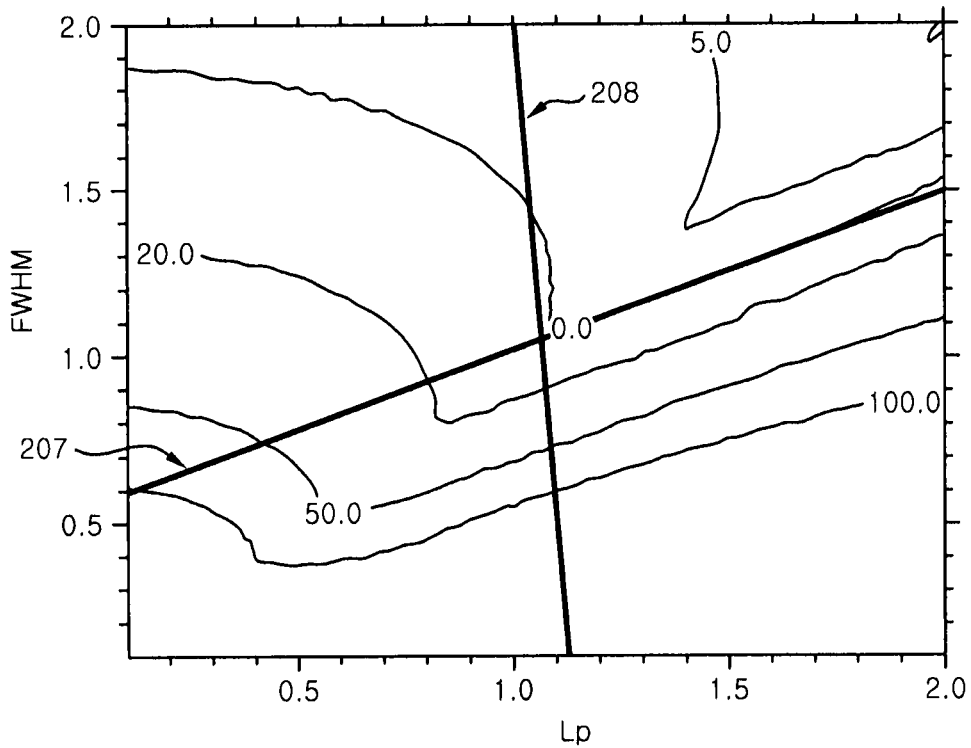
FIG. 13 is a characteristic view showing uniformity of a microwave plasma density distribution obtained according to a second simulation.

FIG. 13 shows a result of the second simulation. In FIG. 13, the horizontal axis represents Lp and the vertical axis represents FWHM. FIG. 13 shows values of an indicator of the degree of uniformity of the same microwave plasma density distribution as the first simulation and curves drawn by interconnecting points having the equivalent values. It can be seen from FIG. 13 that the uniformity of the microwave plasma density distribution is improved with increase in Lp and FWHM.

Like the first simulation, the values of the indicator of the degree of uniformity of the microwave plasma density distribution are preferably equal to or less than, for example, 10%. To achieve this, it is preferable that Lp and FWHM satisfy the following equations (5) and (6).

$$FWHM \geq 0.47 \times Lp + 0.56 \quad (5)$$

$$FWHM \geq -19 \times Lp + 21 \quad (6)$$

In FIG. 13, reference numeral 207 denotes a straight line expressed by FWHM=0.47×Lp+0.56 and reference numeral 208 denotes a straight line expressed by FWHM=−19×Lp+21. As can be understood from the result of the second simulation, when the three microwave transmitting plates 273A, 273B and 273C are arranged as shown in FIG. 12, it is preferable that a distance Lp between the center points P$_A$, P$_B$ and P$_C$ of the three microwave transmitting plates 273A, 273B and 273C satisfies the above equations (5) and (6).

Other configuration, operation and effects in this embodiment are the same as those in the first embodiment.

In contrast, the number of microwave transmitting plates 73 in the first embodiment is seven which is larger than the number (three) of the microwave transmitting plates 273 in the second embodiment. However, the arrangement of the microwave transmitting plates 73 shown in FIG. 8 in the first embodiment can provide a smaller diameter of the ceiling 11 than the arrangement of the microwave transmitting plates 273 shown in FIG. 12 in the second embodiment, as will be described in detail below.

Figure 14A:
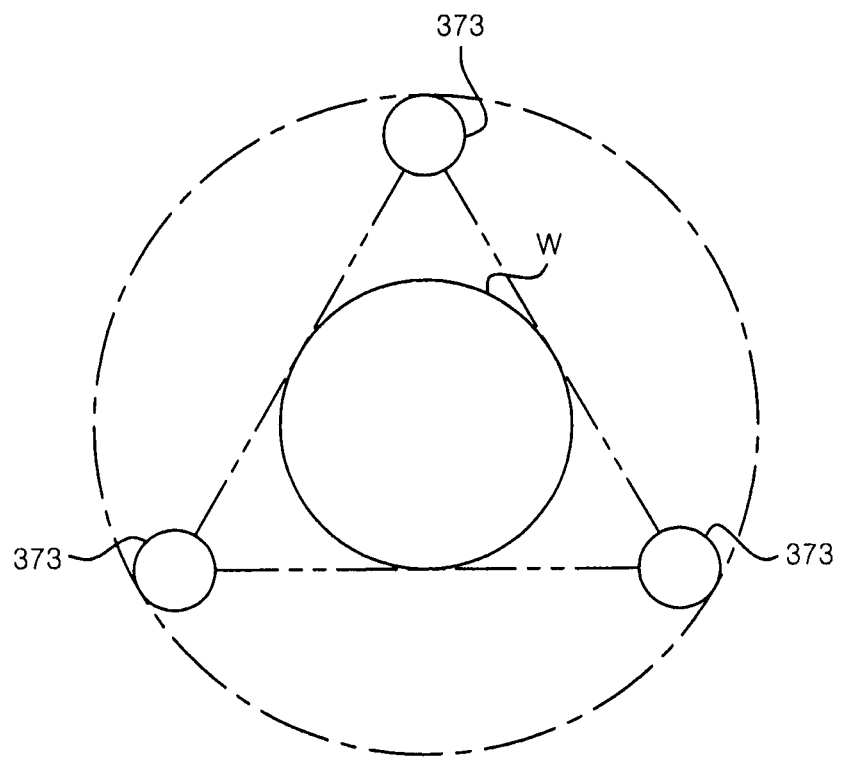
FIGS. 14A to 14E are explanatory views showing a relationship between the arrangement of the microwave transmitting plates and a diameter of a ceiling of a process chamber.
Figure 14B:
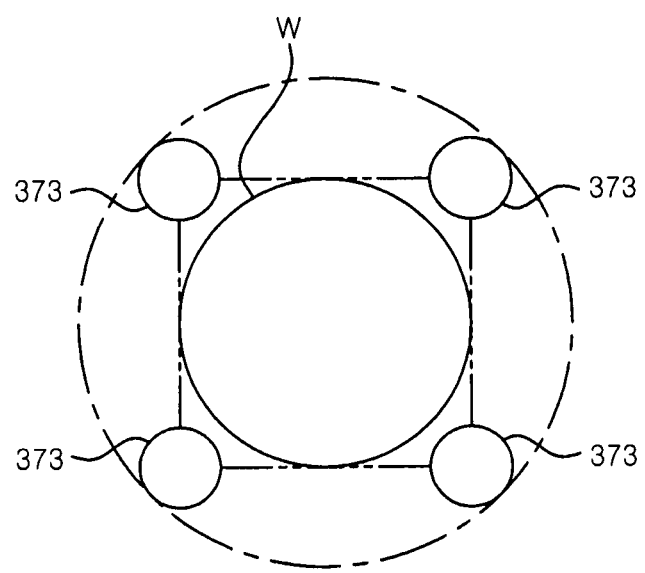
Figure 14C:
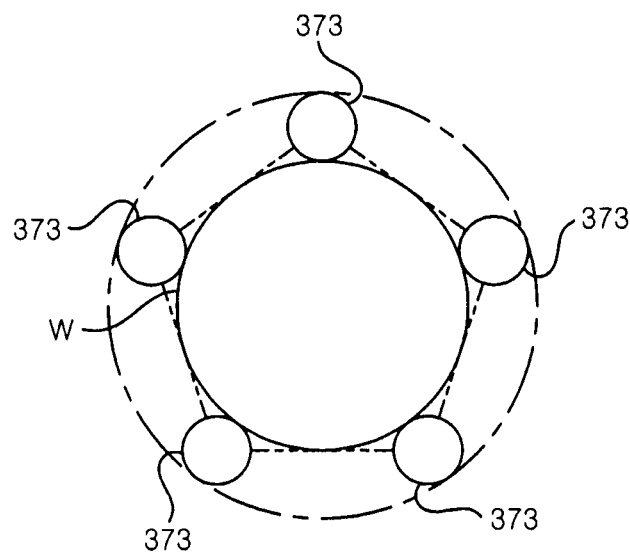
Figure 14D:
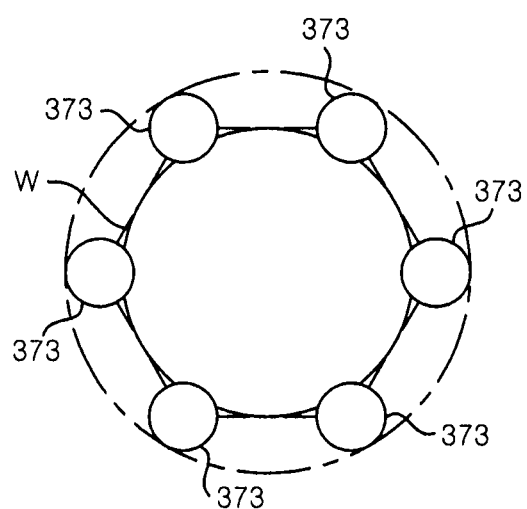
Figure 14E:
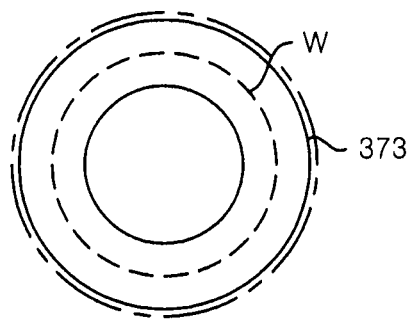

It is here considered that a plurality of microwave transmitting plates 373 is arranged with their center points coinciding with apexes of a polygon. FIGS. 14A to 14E are explanatory views showing simplified arrangement of the plurality of microwave transmitting plates 373. FIGS. 14A to 14D show arrangement of the microwave transmitting plates 373 whose number is 3 to 6 and FIG. 14E shows arrangement of the microwave transmitting plates 373 whose number is infinite. The microwave transmitting plates 373 shown in FIG. 14A correspond to the microwave transmitting plates 273A to 273C in the second embodiment and the microwave transmitting plates 373 shown in FIG. 14B correspond to the microwave transmitting plates 73A to 73F in the first embodiment.

In FIGS. 14A to 14E, each of outer edges of polygons indicated by a two-dot chain line encompasses a plane shape of the wafer W and contacts the outer edge of the plane shape of the wafer W. In this case, the minimal diameter of the ceiling 11 indicated by a one-dot chain line in FIG. 14 is equal to the sum of a diameter of a circle passing all of the center points of the microwave transmitting plates 373 (a circumscribed circle of the polygon) and a diameter of each microwave transmitting plate 373. The radius R of the circle is expressed by the following equation (7).

$$R = Dw / \{2 \cdot \cos(\pi/Np)\} \quad (7)$$

Figure 15:
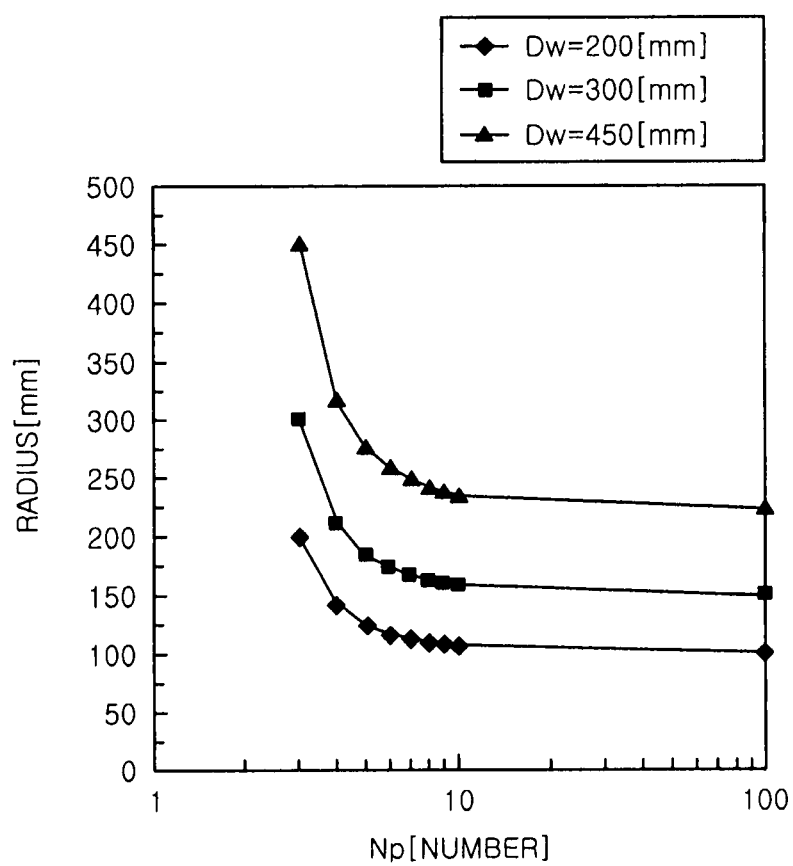
FIG. 15 is a characteristic view showing a relationship between the number of microwave transmitting plates and a radius of a circle passing all of center points of the microwave transmitting plates.

In Equation (7), Dw denotes the diameter of the wafer W and Np denotes the number of microwave transmitting plates 373. The minimal diameter of the ceiling 11 is obtained from the above equation (7) and the diameter of each microwave transmitting plate 373. FIG. 15 shows a relationship between the number Np of microwave transmitting plates 373 and the radius R of the circle. In FIG. 15, the horizontal axis represents the number Np of microwave transmitting plates 373 and the vertical axis represents the radius R of the circle. As can be understood from FIG. 15, the radius of the ceiling is decreased with increase in the number Np of microwave transmitting plates 373. As can be understood from this result, the first embodiment where the number of microwave transmitting plates 73 is 7 can provide a smaller diameter of the ceiling than the second embodiment where the number of microwave transmitting plates 273 is 3.

Thus, the first embodiment can make the process chamber 2 more compact by making the diameter of the ceiling 11 smaller than the second embodiment. On the other hand, the second embodiment can provide the less number of antenna modules 61 by providing the less number of microwave transmitting plates 273 than the first embodiment. Whether to arrange microwave transmitting plates as shown in FIG. 8 in the first embodiment or as shown in FIG. 12 in the second embodiment may depend on the required specifications of the plasma processing apparatus 1.

Next, other effects of each of the above embodiments will be described. As described above, in the plasma processing apparatus 1 of each of the above embodiments, microwaves are introduced from a plurality of portions into the process chamber 2. In comparison, a plasma processing apparatus which introduces a microwave from a single portion into the process chamber is here referred to as a second comparative example plasma processing apparatus. The effects of each of the above embodiments will be described in comparison with the second comparative example plasma processing apparatus below.

Figure 16:
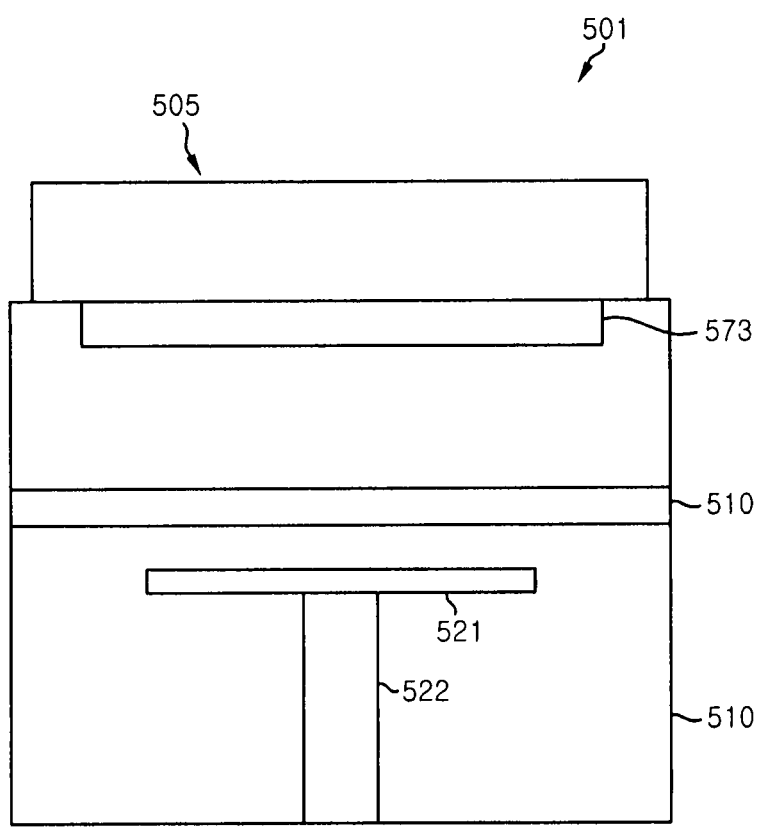
FIG. 16 is a schematic sectional view showing configuration of a plasma processing apparatus of a second comparative example.

FIG. 16 is a schematic sectional view showing configuration of a second comparative example plasma processing apparatus. A second comparative example plasma processing apparatus 501 includes a process chamber 502, a mounting table 521 and a support member 522. The process chamber 502, the mounting table 521 and the support member 522 have the same configuration as the process chamber 2, the mounting table 21 and the support member 22 shown in FIG. 1.

The plasma processing apparatus 501 includes a microwave introduction device 505 instead of the microwave introduction device 505 shown in FIGS. 1 and 3. The microwave introduction device 5 is disposed above the process chamber 502. An example of the microwave introduction device 505 may include a microwave introduction device having a known structure including a single microwave transmitting plate 573. The microwave transmitting plate 573 has, for example, a disc shape. A diameter of a plane shape of the microwave transmitting plate 573 is, for example, 460 mm, which is larger than that of the wafer W.

The plasma processing apparatus 501 further includes a plate-like shower plate 510 having a plurality of through holes. The shower plate 510 is disposed between the mounting table 521 and the microwave introduction device 505 in a manner to partition the internal space of the process chamber 502 vertically. The shower plate 510 may be made of, for example, quartz. The shower plate 510 is provided depending on the kind of plasma process in the plasma processing apparatus 501. As an example, the shower plate 510 is provided when plasma process is performed using low density plasma in the plasma processing apparatus 501.

Other configurations of the plasma processing apparatus 501 are the same as those of the plasma processing apparatus 1 of the first or second embodiment.

In the plasma processing apparatus 501, since the number of microwave transmitting plate 573 is 1, there is a need to make the plane shape of the microwave transmitting plate 573 larger than the plane shape of the wafer W. An increased area of the microwave transmitting plate 573 results in increased microwave power required for stable plasma ignition and discharging. For example, if the microwave transmitting plate 573 has a disc shape and a diameter of the plane shape of the microwave transmitting plate 573 is 460 mm, the minimum of microwave power required for stable plasma ignition and discharging is 1000 W.

Relatively high density plasma is generated with the increase in the microwave power as described above. Here, if plasma process is performed using low density plasma in the plasma processing apparatus 501, there is a need to change the configuration of the plasma processing apparatus 501. For example, it is possible to achieve low plasma density near the wafer W by separating the microwave transmitting plate 573 from the wafer W by using the shower plate 510.

In contrast, a plurality of microwave transmitting plates 73 or 273 are provided in each of the above embodiments has smaller areas than the area of the microwave transmitting plate 573 of the plasma processing apparatus 501. If the microwave transmitting plates 73 or 273 have a cylindrical shape, the diameter of the plane shape of the microwave transmitting plates 73 and 273 is within a range of, for example, 90 to 200 mm. As a result, each embodiment can provide less microwave power required for stable plasma ignition and discharging than the plasma processing apparatus 501. Accordingly, each embodiment can provide the plasma processing apparatus 1 capable of performing plasma process using the low density plasma in addition to the high density plasma with the same single configuration without changing the configuration of the plasma processing apparatus 1. That is, since each embodiment provides a higher degree of freedom for plasma density control than the second comparative example plasma processing apparatus 501, it is possible to perform plasma process using low to high density plasma with the same single apparatus configuration.

Results of experiments showing the above-mentioned effect will be now described. In the experiments, first, the plasma nitriding described in the first embodiment was carried out in the plasma processing apparatus 501. Here, the wafer W mounted on the mounting table 521 was subjected to plasma nitriding using high density plasma (hereinafter referred to as "high density plasma nitriding") and plasma nitriding using low density plasma (hereinafter referred to as "low density plasma nitriding").

Conditions for the high density plasma nitriding in the plasma processing apparatus 501 were as follows. A distance (gap) between the microwave transmitting plate 573 and the wafer W, microwave power and the internal pressure of the process chamber 502 were set to 79 mm, 1500 W and 20 Pa, respectively. Ar gas of 1000 sccm was used as rare gas for plasma generation and $N_2$ gas of 200 sccm was used as nitriding process gas. Temperature of the wafer W was set to 500° C. The high density plasma nitriding was performed without the shower plate 510 shown in FIG. 16.

Conditions for the low density plasma nitriding in the plasma processing apparatus 501 were as follows. A distance (gap) between the microwave transmitting plate 573 and the wafer W, microwave power and the internal pressure of the process chamber 502 were set to 134 mm, 1500 W and 7 Pa, respectively. Ar gas of 1000 sccm was used as rare gas for plasma generation and $N_2$ gas of 40 sccm was used as nitriding process gas. Temperature of the wafer W was set to 500° C. The low density plasma nitriding was performed with the shower plate 510 shown in FIG. 16.

In the experiments, next, by using a plasma processing apparatus including seven microwave transmitting plates 73 (hereinafter referred to as an "embodiment plasma processing apparatus"), such as the plasma processing apparatus 1 of the first embodiment, as the plasma processing apparatus 1 of each of the above-described embodiments, the wafer W mounted on the mounting table 21 was subjected to high density plasma nitriding and low density plasma nitriding. In the experiments, a distance (gap) between each of the microwave transmitting plates 73 and the wafer W was set to 85 mm. No shower plate was provided in the process chamber 2.

For the high density plasma nitriding in the embodiment plasma processing apparatus, microwave power introduced from one microwave transmitting plate 73 was set to 400 W. Other conditions for the high density plasma nitriding in the embodiment plasma processing apparatus were the same as those for the high density plasma nitriding in the plasma processing apparatus 501 except a distance (gap) between the microwave transmitting plate 73 and the wafer W.

For the low density plasma nitriding in the embodiment plasma processing apparatus, microwave power introduced from one microwave transmitting plate 73 was set to 50 W. Other conditions for the low density plasma nitriding in the embodiment plasma processing apparatus were the same as those for the low density plasma nitriding in the plasma processing apparatus 501 except a distance (gap) between the microwave transmitting plate 73 and the wafer W and the presence of a shower plate.

Figure 17:
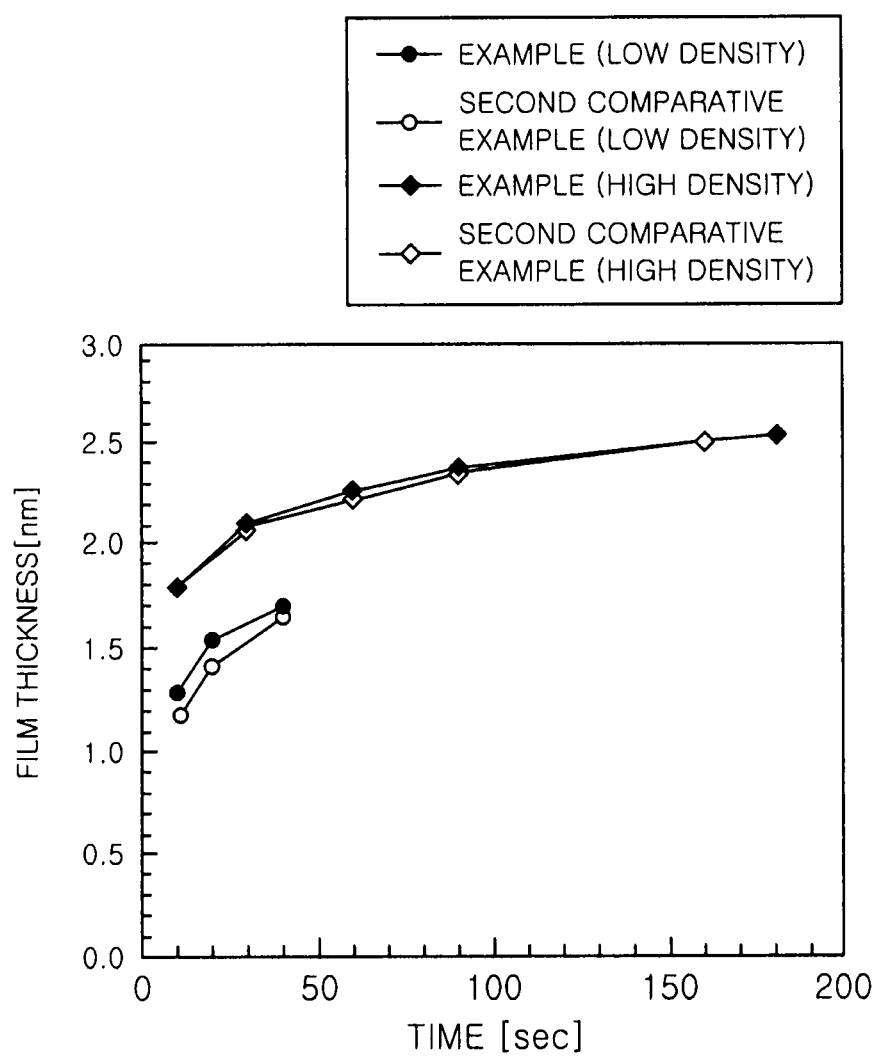
FIG. 17 is a characteristic view showing nitride film thickness in high density plasma nitriding and nitride film thickness in low density plasma nitriding.

FIG. 17 is a characteristic view showing nitride film thickness in the high density plasma nitriding and nitride film thickness in the low density plasma nitriding. In FIG. 17, the horizontal axis represents nitriding time and the vertical axis represents nitride film thickness. It can be seen from FIG. 17 that the embodiment plasma processing apparatus shows substantially the same relationship between the nitriding time and the nitride film thickness as the second comparative example plasma processing apparatus 501 either in the high density plasma nitriding or in the low density plasma nitriding. As can be understood from this result, for the second comparative example plasma processing apparatus 501, there is a need to change its configuration in order to perform both of the high density plasma nitriding and the low density plasma nitriding. In contrast, the embodiment plasma processing apparatus can perform both of the high density plasma nitriding and the low density plasma nitriding with the same single configuration without having to change its configuration.

Figure 18:
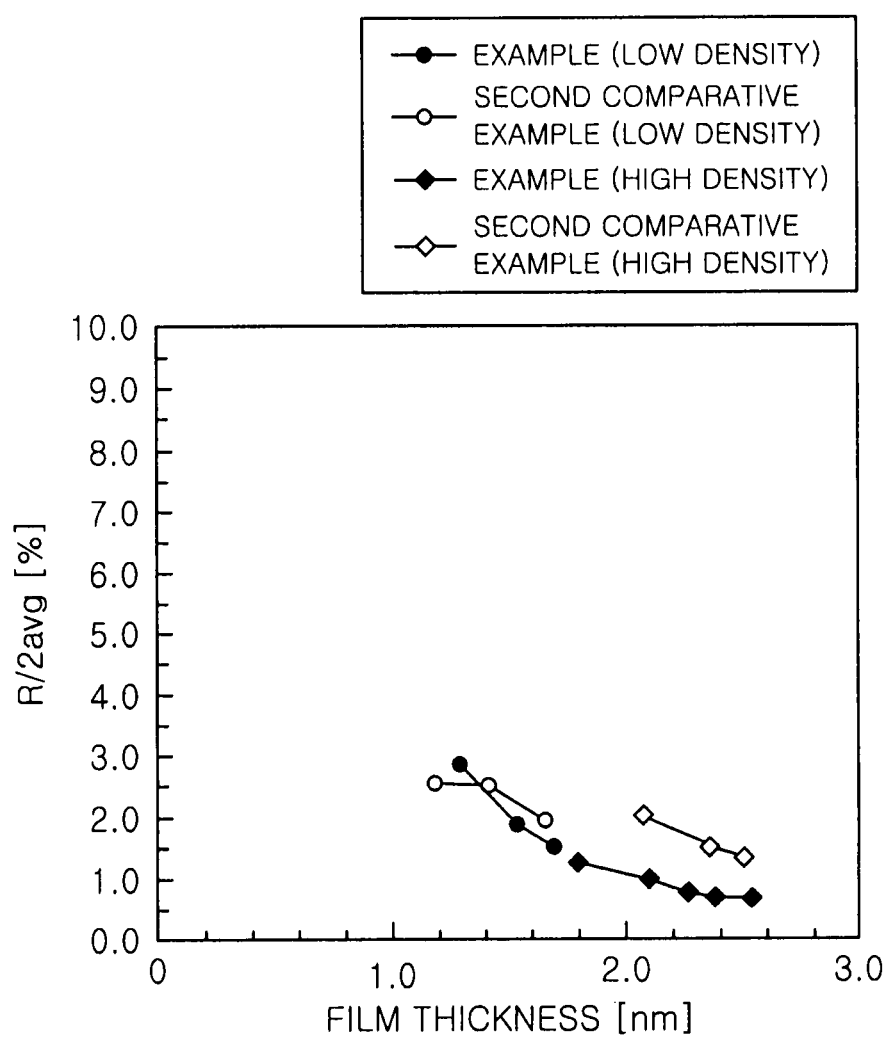
FIG. 18 is a characteristic view showing uniformity of the nitride film thicknesses in the plasma nitriding shown in FIG. 17.

In addition, the embodiment plasma processing apparatus can perform more uniform plasma process on the wafer W than the second comparative example plasma processing apparatus 501. FIG. 18 is a characteristic view showing uniformity of the nitride film thicknesses in the plasma nitriding shown in FIG. 17. In FIG. 18, the horizontal axis represents nitride film thickness and the vertical axis represents R/2avg which is a uniformity indicator. R/2avg refers to a value (in percentage) obtained by dividing ½ of a difference between the maximum and the minimum of nitride film thickness by a mean value of nitride film thicknesses. It can be seen from FIG. 18 that the embodiment plasma processing apparatus shows a smaller R/2avg in the high density plasma nitriding than the second comparative example plasma processing apparatus 501. This result shows that the embodiment plasma processing apparatus provides a nitride film having more uniform thickness in the plane of the wafer W than the second comparative example plasma processing apparatus 501.

It is difficult for the plasma processing apparatus 501 to provide a uniform plasma density distribution since the microwave transmitting plate 573 has a large area. In contrast, each of the microwave transmitting plates 73 in the embodiment plasma processing apparatus has a smaller area than the microwave transmitting plate 573. Accordingly, the embodiment plasma processing apparatus provides a more uniform density distribution of plasma produced by microwaves introduced from the individual microwave transmitting windows 73 than the plasma processing apparatus 501. In addition, in the embodiment plasma processing apparatus, as described in the first embodiment, the microwave transmitting windows 73 are arranged such that the plasma density distribution becomes uniform near the wafer W. Accordingly, the embodiment plasma processing apparatus provides a more uniform plasma density distribution near the wafer W than the plasma processing apparatus 501. As a result, the embodiment plasma processing apparatus provides a more uniform nitride film than the plasma processing apparatus 501.

In addition, according to the above embodiments, it is possible to change nitrogen density of the nitride film as well as the above-mentioned nitride film thickness.

In addition, according to the above embodiments, in one plasma processing apparatus 1, it is possible to perform plasma process successively while changing plasma density without unloading the wafer from the process chamber 2. For example, the following processes (1) to (4) are possible.

(1) It is possible to perform a process of forming a thick oxide film on the wafer W by using high density plasma and slightly nitriding the top surface of the oxide film by using low density plasma.

(2) It is possible to perform an etching process while changing plasma density depending on the type of a film when the film is etched. In this case, it is possible to change the plasma density successively without stopping plasma generation and prevent jump of plasma mode.

(3) It is possible to perform a modification process while changing plasma density when an etching mask is modified by plasma nitriding. Accordingly, selectivity of the etching mask to a film to be etched in the etching process can be improved.

(4) It is possible to perform an ashing process using low density oxygen plasma in order to remove the etching mask after performing the etching process using the high density plasma.

In addition, according to the above embodiments, there is no need to provide the shower plate 510 as in the plasma processing apparatus 501, thereby preventing transport efficiency of active species in plasma from being deteriorated. Accordingly, with the above embodiments, for example, it is possible to prevent film quality from being deteriorated in the film forming process.

In addition, according to the above embodiments, it is possible to make the process chamber 2 compact since there is no need to provide the shower plate 510 and accordingly a gap can be made smaller than that in the plasma processing apparatus 501. Accordingly, with the above embodiments, it is possible to perform a process difficult to be performed when a volume or gap of the internal space of the process chamber 2 is large, for example, a film forming process using a PE-ALD method.

In addition, according to the above embodiments, there is no need to provide the shower plate 510 which is the cause of deactivation of ions in plasma, thereby increasing plasma ionicity over the plasma processing apparatus 501. This characteristic is especially effective for a process of applying a high frequency bias to the mounting table 21. Accordingly, with the above embodiments, for example, it is possible to improve a modification effect by highly ionic plasma in a modification process using oxygen plasma.

The present invention is not limited to the above embodiments but may be modified in various ways. For example, the plasma processing apparatus or the microwave introduction device of the present invention may be applied to a plasma oxidation apparatus, plasma CVD processing apparatus, plasma etching apparatus, plasma ashing apparatus and so on in addition to a plasma nitriding apparatus. In addition, the plasma processing apparatus or the microwave introduction device of the present invention is not limited to a case where a semiconductor wafer is employed as an object, but may be applied to a plasma processing apparatus where a substrate for solar cell panel, a substrate for flat panel display and so on are employed as objects.

In addition, although the microwave plasma processing apparatus has been illustrated in the above embodiments, the present invention may be applied to plasma processing apparatuses of other types, for example, an ICP plasma type, ECR plasma type, surface wave plasma type, magnetron plasma type and so on. Further, the present invention is not limited to a vacuum process but may be applied to atmospheric plasma.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
a process chamber for accommodating an object to be processed;
a mounting table placed within the process chamber, the mounting table having mounting surface on which the object is mounted;
a gas supply mechanism for supplying a process gas into the process chamber; and
a microwave introduction device for generating a microwave to produce plasma of the process gas in the process chamber and for introducing the microwave into the process chamber,
wherein the microwave introduction device includes a conductive member which is disposed above the process chamber and has a plurality of openings, and a plurality of microwave transmitting windows which is fitted into the respective openings and transmits and introduces the microwave into the process chamber,
wherein the microwave transmitting windows are arranged on one virtual plane parallel to the mounting surface, with the microwave transmitting windows fitted into the respective openings, the microwave transmitting windows including a first microwave transmitting window and second and third microwave windows adjacent to the first microwave transmitting window, and
wherein the first to third microwave transmitting windows are arranged in such a manner that a distance between the center point of the first microwave transmitting window and the center point of the second microwave transmitting window becomes equal or approximately equal to a distance between the center point of the first microwave transmitting window and the center point of the third microwave transmitting window,
wherein the microwave transmitting windows include one center microwave transmitting window arranged in the central portion of the conductive member and at least six outer microwave transmitting windows arranged in the outside of the central portion to surround the center microwave transmitting window,
wherein the six outer microwave transmitting windows and the center microwave transmitting window are arranged in such a manner that six regular triangles are formed in a plane shape by interconnecting three adjacent center points selected from the center points of the six outer microwave transmitting windows and the center microwave transmitting window and a virtual regular hexagon is formed by the six regular triangles,
wherein a plane shape of the object is circular,
wherein density distributions of a plurality of microwave plasmas produced by microwaves introduced from the microwave transmitting windows into the process chamber are equal to each other, and
wherein, assuming that a diameter of the plane shape of the object is 1 and a distance between the center points of any two adjacent microwave transmitting windows is Lp, a value of 0.37×Lp+0.26 is equal to or larger than a full width at half maximum of the density distributions of the plurality of microwave plasmas and a value of 3.80×Lp−1.04 is equal to or smaller than a full width at half maximum of the density distributions of the microwave plasmas.

2. The plasma processing apparatus of claim 1, wherein outer edges of the virtual regular hexagon include a figure formed by projecting the plane shape of the object onto the virtual plane.

3. The plasma processing apparatus of claim 1, wherein the microwave introduction device includes a microwave output unit which generates microwaves and distributes the microwaves into a plurality of paths, and a plurality of microwave introduction modules, each including one microwave transmitting window, which introduces the microwaves output from the microwave output unit into the process chamber, and
wherein the microwave introduction modules have the same configuration.

4. A microwave introduction device for generating a microwave to produce plasma of the process gas in a process chamber accommodating an object and for introducing the microwave into the process chamber, comprising:
a conductive member which is disposed above the process chamber and has a plurality of openings; and
a plurality of microwave transmitting windows which is fitted into the respective openings and transmits and introduces the microwave into the process chamber,
wherein the microwave transmitting windows are arranged on one virtual plane parallel to the mounting surface, with the microwave transmitting windows fitted into the respective openings, the microwave transmitting windows including a first microwave transmitting window and second and third microwave windows adjacent to the first microwave transmitting window,
wherein the first to third microwave transmitting windows are arranged in such a manner that a distance between the center point of the first microwave transmitting window and the center point of the second microwave transmitting window becomes equal or approximately equal to a distance between the center point of the first microwave transmitting window and the center point of the third microwave transmitting window,
wherein the microwave transmitting windows include one center microwave transmitting window arranged in the central portion of the conductive member and at least six outer microwave transmitting windows arranged in the outside of the central portion to surround the center microwave transmitting window,
wherein the six outer microwave transmitting windows and the center microwave transmitting window are arranged in such a manner that six regular triangles are formed in a plane shape by interconnecting center points of the six outer microwave transmitting windows and the center microwave transmitting window and a virtual regular hexagon is formed by the six regular triangle,
wherein a plane shape of the object is circular,
wherein density distributions of a plurality of microwave plasmas produced by microwaves introduced from the microwave transmitting windows into the process chamber are equal to each other, and
wherein, assuming that a diameter of the plane shape of the object is 1 and a distance between the center points of any two adjacent microwave transmitting windows is Lp, a value of $0.37 \times Lp + 0.26$ is equal to or larger than a full width at half maximum of the density distributions of the plurality of microwave plasmas and a value of $3.80 \times Lp - 1.04$ is equal to or smaller than a full width at half maximum of the density distributions of the microwave plasmas.

5. The microwave introduction device of claim 4, wherein outer edges of the virtual regular hexagon include a figure formed by projecting the plane shape of the object onto the virtual plane.

6. The microwave introduction device of claim 4, further comprising:
a microwave output unit which generates microwaves and distributes the microwaves into a plurality of paths; and
a plurality of microwave introduction modules, each including one microwave transmitting window, which introduces the microwaves output from the microwave output unit into the process chamber,
wherein the microwave introduction modules have the same configuration.

* * * * *